(12) United States Patent
Fukasawa

(10) Patent No.: US 12,398,458 B2
(45) Date of Patent: *Aug. 26, 2025

(54) SPUTTERING DEVICE

(71) Applicant: Samsung Display Co., LTD., Yongin-si (KR)

(72) Inventor: Takayuki Fukasawa, Seoul (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 0 days.

This patent is subject to a terminal disclaimer.

(21) Appl. No.: 17/735,307

(22) Filed: May 3, 2022

(65) Prior Publication Data

US 2023/0065664 A1    Mar. 2, 2023

(30) Foreign Application Priority Data

Aug. 26, 2021 (KR) .................. 10-2021-0113111

(51) Int. Cl.
  *C23C 14/35* (2006.01)
  *C23C 14/34* (2006.01)
  *C23C 14/50* (2006.01)
  *H01J 37/34* (2006.01)

(52) U.S. Cl.
  CPC .......... *C23C 14/35* (2013.01); *C23C 14/3407* (2013.01); *C23C 14/50* (2013.01); *H01J 37/3423* (2013.01); *H01J 37/3435* (2013.01); *H01J 37/3455* (2013.01)

(58) Field of Classification Search
  CPC ..... C23C 14/35; C23C 14/3407; C23C 14/50; H01J 37/3429; H01J 37/3435; H01J 37/3408; H01J 37/3423; H01J 37/3455

USPC .............. 204/298.18, 298.23, 298.11, 298.2
  See application file for complete search history.

(56) References Cited

U.S. PATENT DOCUMENTS

| 4,401,539 A | 8/1983 | Abe et al. |
| 4,606,802 A | 8/1986 | Kobayashi et al. |
| 5,130,005 A | 7/1992 | Hurwitt et al. |
| 5,489,369 A * | 2/1996 | Bjornard ............... C23C 14/50 |
|  |  | 118/721 |
| 6,024,843 A * | 2/2000 | Anderson ............... C23C 14/35 |
|  |  | 204/298.18 |

(Continued)

FOREIGN PATENT DOCUMENTS

| EP | 2586889 | 5/2013 |
| GB | 2588939 | 5/2021 |

(Continued)

OTHER PUBLICATIONS

Machine Translation JP03-243763 (Year: 1990).*
Extended European Search Report—European Application No. EP 22191801.4 dated Jan. 18, 2023.

*Primary Examiner* — Rodney G McDonald
(74) *Attorney, Agent, or Firm* — CANTOR COLBURN LLP

(57) ABSTRACT

A sputtering device includes a substrate transferring unit which moves a substrate, a back plate disposed above the substrate transferring unit and supporting a target, and a magnet disposed on a second surface of the back plate which is opposite to a first surface of the back plate facing the substrate transferring unit, where the back plate includes a first portion and a second portion, which is bent from the first portion at a first angle.

17 Claims, 20 Drawing Sheets

(56) References Cited

U.S. PATENT DOCUMENTS

| | | | | |
|---|---|---|---|---|
| 6,365,010 B1* | 4/2002 | Hollars | ............... | C23C 14/35 |
| | | | | 204/192.12 |
| 2004/0231973 A1* | 11/2004 | Sato | ............... | H01J 37/3455 |
| | | | | 204/298.18 |
| 2005/0115827 A1* | 6/2005 | Wickramanayaka | ............... | |
| | | | | C23C 14/046 |
| | | | | 204/298.18 |
| 2013/0105298 A1 | 5/2013 | Tsunekawa et al. | | |
| 2013/0299345 A1* | 11/2013 | Abarra | ............... | C23C 14/225 |
| | | | | 204/298.11 |
| 2015/0114835 A1* | 4/2015 | Gomi | ............... | H01J 37/3447 |
| | | | | 204/298.08 |
| 2016/0079045 A1 | 3/2016 | Tsunekawa et al. | | |
| 2018/0254172 A1 | 9/2018 | Tsunekawa et al. | | |
| 2020/0095672 A1 | 3/2020 | Honma et al. | | |
| 2021/0207261 A1 | 7/2021 | Ishibashi et al. | | |
| 2022/0396865 A1 | 12/2022 | Rendall et al. | | |

FOREIGN PATENT DOCUMENTS

| | | | |
|---|---|---|---|
| JP | 03-243763 | * | 7/1990 |
| JP | 1996026453 B2 | | 3/1996 |
| JP | 2000129433 A | | 5/2000 |
| JP | 5882934 B2 | | 3/2016 |
| JP | 201633266 | | 3/2016 |

* cited by examiner

100: 110, 120
110: 111, 112
120: 121, 122

SPUTTERING DEVICE

This application claims priority to Korean Patent Application No. 10-2021-0113111, filed on Aug. 26, 2021, and all the benefits accruing therefrom under 35 U.S.C. § 119, the content of which in its entirety is herein incorporated by reference.

BACKGROUND

1. Field

Embodiments of the invention relate to a sputtering device.

2. Description of the Related Art

Display devices are becoming more important with developments in multimedia technology. Accordingly, various display devices such as a liquid crystal display ("LCD") device, an organic light-emitting diode ("OLED") display device, and the like have been used.

Patterning processes for forming various thin films may be performed during the fabrication of a display device. When forming fine patterns through the patterning of thin films, almost undamaged, high-quality thin films are desired to be formed. Thin films may be formed by various methods such as chemical vapor deposition ("CVD"), atomic layer deposition ("ALD"), or sputtering, depending on the material and the purpose of use of the thin films. Sputtering is a type of vacuum deposition that forms a thin film on a substrate in the vicinity by generating plasma at relatively low pressure, accelerating a gas such as an argon gas, and colliding the gas with a target to eject molecules.

SUMMARY

Embodiments of the invention provide a sputtering device capable of forming a thin film with a high deposition density.

An embodiment of the invention provides a sputtering device including a substrate transferring unit which moves a substrate, a back plate disposed above the substrate transferring unit and supporting a target, and a magnet disposed on a second surface of the back plate which is opposite to a first surface of the back plate facing the substrate transferring unit, where the back plate includes a first portion and a second portion, which is bent from the first portion at a first angle.

In an embodiment, a first line drawn from a surface of the first portion toward the substrate transferring unit and a second line drawn from a surface of the second portion toward the substrate transferring unit may intersect each other to form the first angle.

In an embodiment, the magnet may include a first magnet, which is disposed on the first portion, and second magnet, which is disposed on the second portion, and the first and second lines may pass through a center of the first magnet and a center of the second magnet, respectively.

In an embodiment, the first and second lines may intersect each other on the substrate.

In an embodiment, the first magnet may reciprocate on the first portion, and the second magnet may reciprocate on the second portion.

In an embodiment, a distance between the first and second magnets may be constant.

In an embodiment, the back plate further includes a third portion, which is bent from the first portion at a second angle and extends in a direction opposite to a direction in which the second portion extends.

In an embodiment, a third line drawn from a surface of the third portion toward the substrate transferring unit may intersect the first line to form the second angle.

In an embodiment, the first, second, and third lines may intersect one another at a deposition focal point.

In an embodiment, the deposition focal point may be formed on the substrate.

In an embodiment, the substrate transferring unit may include a frame, which extends in one direction, and a support, which is movable along the frame, and the support may support side surfaces of the substrate.

In an embodiment, the target may have a bottom surface having a curved shape which faces the substrate transferring unit, and a center of curvature of the bottom surface of the target may be on the substrate.

In an embodiment, the back plate may have a bottom surface having a curved shape which faces the substrate transferring unit, and a center of curvature of the bottom surface of the back plate may be on the substrate.

In an embodiment, the target may include a first target, which is disposed on the first portion, and a second target, which is disposed on the second portion and may be separate from the first target.

In an embodiment, the first and second targets may include different materials from each other.

An embodiment of the invention provides a sputtering device including a substrate transferring unit which moves a substrate, a back plate disposed above the substrate transferring unit and supporting a target, and a magnet disposed on a surface of the back plate which is opposite to a surface of the back plate facing the substrate transferring unit. In such an embodiment, the back plate includes a first portion, which is disposed in parallel to the substrate, a second portion, which is bent and extends from one side of the first portion at a first angle, and a third portion, which is bent and extends from the other side of the first portion at a second angle. In such an embodiment, the magnet includes a first magnet, which is disposed on the first portion, a second magnet, which is disposed on the second portion, and a third magnet, which is disposed on the third portion.

In an embodiment, a first line of the first portion that passes through the first magnet, a second line of the second portion that passes through the second magnet, and a third line of the third portion that passes through the third magnet may intersect one another at a same location.

In an embodiment, the first and second lines may form the first angle, and the first and third lines may form the second angle.

In an embodiment, the first magnet may reciprocate on the first portion, the second magnet may reciprocate on the second portion, and the third magnet may reciprocate on the third portion.

In an embodiment, the target may include a first target, which is disposed on the first portion, a second portion, which is disposed on the second portion and may be separate from the first target, and a third target, which is disposed on the third portion and is separate from the first target. In such an embodiment, the first, second, and third targets may include different materials from each other.

BRIEF DESCRIPTION OF THE DRAWINGS

These and/or other features of the invention will become apparent and more readily appreciated from the following description of the embodiments, taken in conjunction with the accompanying drawings, in which.

DETAILED DESCRIPTION

Figure 1A:
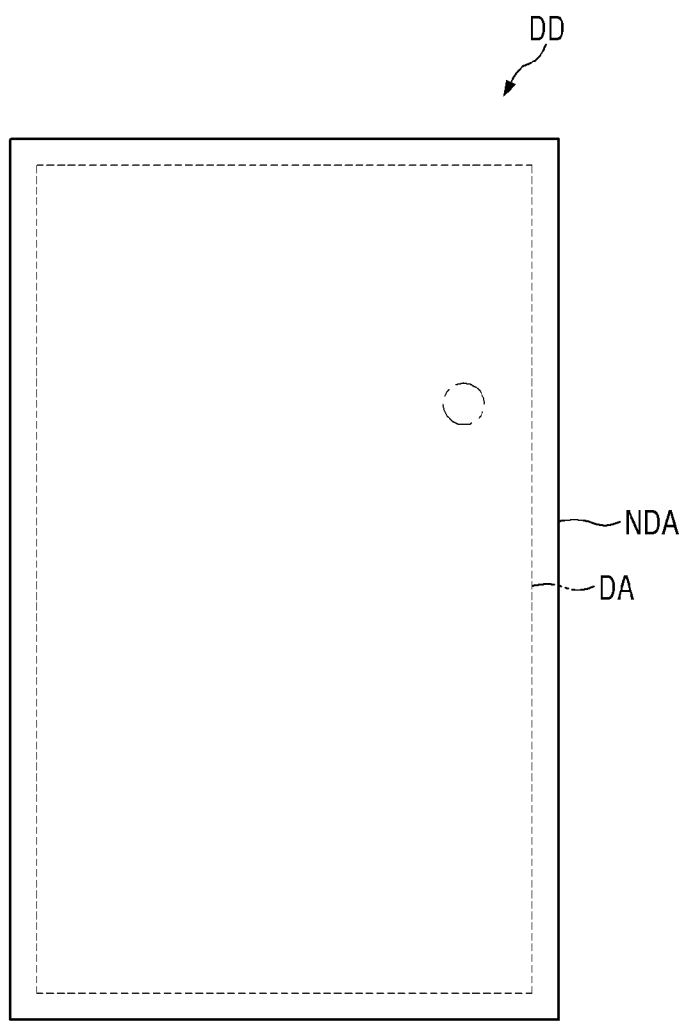
FIG. 1A is a plan view of a display device according to an embodiment of the disclosure.

Embodiments of the invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. The same reference numbers indicate the same components throughout the specification. In the attached drawing figures, the thickness of layers and regions is exaggerated for clarity.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

It will also be understood that when a layer is referred to as being "on" another layer or substrate, it can be directly on the other layer or substrate, or intervening layers may also be present. In contrast, when an element is referred to as being "directly on" another element, there are no intervening elements present.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." "At least one of A and B" means "A and/or B." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. A region illustrated or described as flat may, typically, have rough and/or nonlinear features, for example. Moreover, sharp angles that are illustrated may be rounded. Thus, the regions illustrated in the drawing figures are schematic in nature and their shapes are not intended to illustrate the precise shape of a region and are not intended to limit the scope of the claims.

Hereinafter, embodiments of the invention will be described in detail with reference to the accompanying drawings.

Figure 1B:
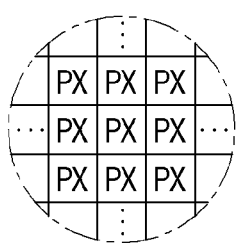
FIG. 1B is an enlarged view of an encircle portion of FIG. 1A.

FIG. 1A is a plan view of a display device according to an embodiment of the disclosure, and FIG. 1B is an enlarged view of an encircle portion of FIG. 1A.

Referring to FIG. 1A, an embodiment of a display device DD displays as moving image or a still image. The display device DD may refer to any type of electronic device that includes a display screen. In an embodiment, for example, the display device DD may encompass a television ("TV"), a notebook computer, a monitor, a billboard, an Internet of Things ("IoT") device, a mobile phone, a smartphone, a tablet personal computer ("PC"), an electronic watch, a smart watch, a watch phone, a head-mounted display, a mobile communication terminal, an electronic notepad, an electronic book, a portable multimedia player ("PMP"), a navigation device, a game console, a digital camera, and a camcorder that provide a display screen.

In an embodiment, the display device DD includes a display panel that provides a display screen. In an embodiment, the display panel may be an inorganic light-emitting diode ("LED") display panel, an organic LED ("OLED") display panel, a quantum-dot LED display panel, a plasma display panel ("PDP"), or a field emission display ("FED") panel, for example. Hereinafter, for convenience of description, embodiments where the display panel is an inorganic LED display panel will be described in detail, but the disclosure is not limited thereto. Alternatively, various other types of display panel may also be applicable to the display device DD.

The shape of the display device DD may be variously modified. In an embodiment, for example, the display device DD may have a rectangular shape that extends longer in a horizontal direction than in a vertical direction, a rectangular shape that extends longer in the vertical direction than in the horizontal direction, a square shape, a tetragonal shape with rounded corners, a non-tetragonal polygonal shape, or a circular shape. A display area DA of the display device DD may have a similar shape to the display device DD. FIG. 1 illustrates an embodiment where the display device DD and the display area DA have a rectangular shape extending longer in the vertical direction than in the horizontal direction.

The display device DD may include the display area DA and da non-display area NDA. The display area DA may be a region in which an image is displayed, and the non-display area NDA may be a region in which no image is displayed. The display area DA may also be referred to as an active area, and the non-display area NDA may also be referred to as an inactive area. The display area DA may generally account for the middle of the display device DD.

In an embodiment, as shown in FIGS. 1A and 1B, the display area DA may include a plurality of pixels PX. The pixels PX may have a rectangular or square shape in a plan view, but the disclosure is not limited thereto. Alternatively, the pixels PX may have a rhombus shape having sides inclined with respect to one direction.

The non-display area NDA may be disposed around the display area DA. The non-display area NDA may surround the entire display area DA or part of the display area DA. The display area DA may have a rectangular shape, and the non-display area NDA may be disposed adjacent to the four sides of the display area DA. The non-display area NDA may form the bezel of the display device DD. In the non-display area NDA, wires or circuit driving units included in the display device DD may be disposed, or external devices may be mounted.

Figure 2:
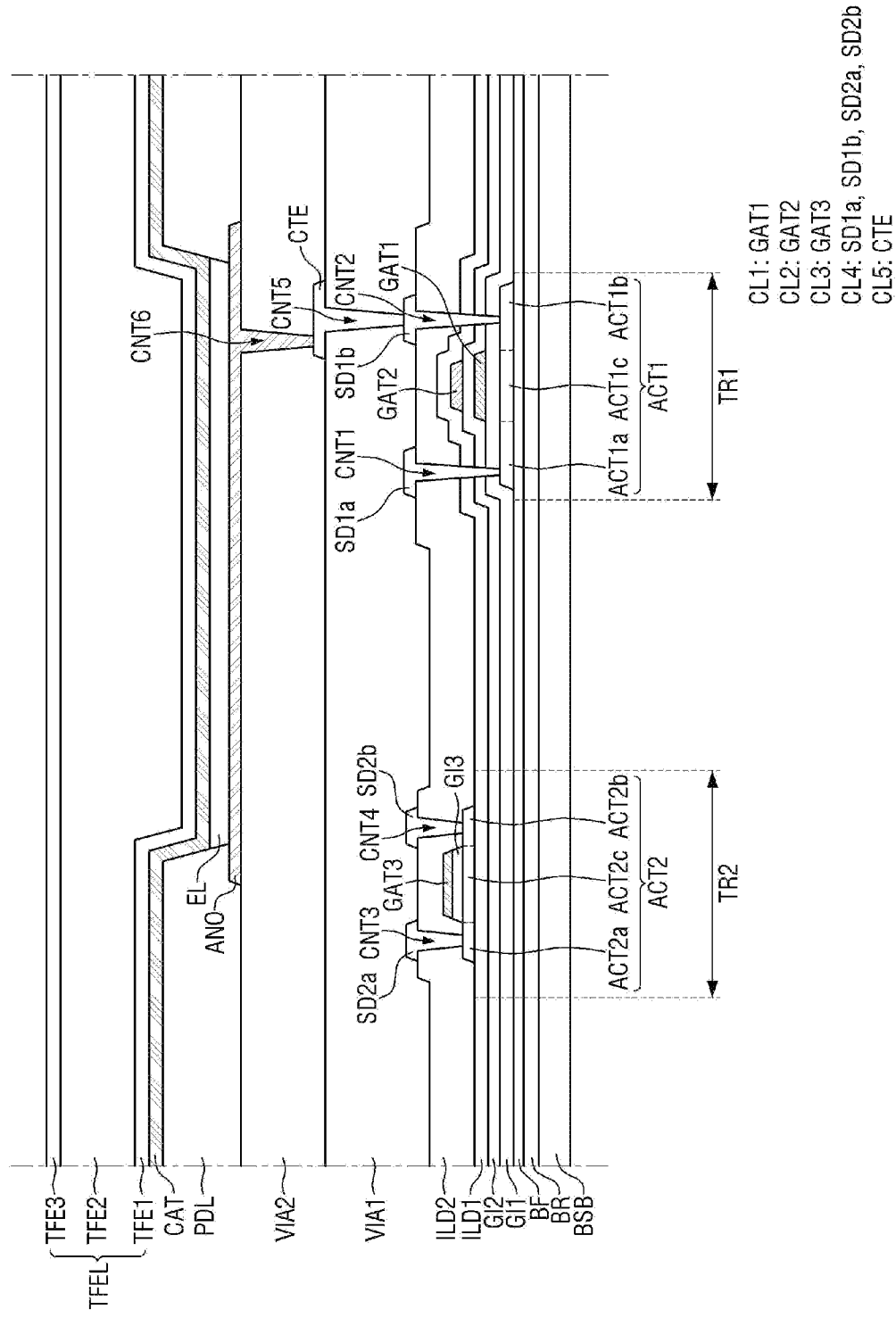
FIG. 2 is a cross-sectional view of a pixel of the display device of FIG. 1A.

FIG. 2 is a cross-sectional view of a pixel of the display device of FIG. 1.

Referring to FIG. 2, in an embodiment, the display area DA may include a first transistor region TR1, in which a non-oxide inorganic semiconductor transistor (hereinafter referred to as the silicon transistor) including polycrystalline silicon as a channel is disposed, and a second transistor region TR2, in which an oxide semiconductor transistor (hereinafter referred to as the oxide transistor) including an oxide semiconductor as a channel is disposed. The silicon transistor in the first transistor region TR1 may be a P-type metal-oxide semiconductor ("PMOS") transistor. The oxide semiconductor in the second transistor region TR2 may be an N-type metal-oxide semiconductor ("NMOS") transistor.

In an embodiment, a base substrate BSB, a barrier layer BR, a buffer layer BF, a first semiconductor layer ACT1, a first gate insulating film GI1, a first conductive layer CL1, a second gate insulating film GI2, a second conductive layer CL2, a first interlayer insulating film ILD1, a second semiconductor layer ACT2, a third gate insulating film GI3, a third conductive layer CL3, a second interlayer insulating film ILD2, a fourth conductive layer CL4, a first via layer VIA1, a fifth conductive layer CL5, a second via layer VIA2, a pixel electrode ANO, and a pixel-defining film PDL may be sequentially disposed one on another in the display area DA. Such layers may be formed as or defined by single films or as stacks of multiple films. In such an embodiment, other layers may be disposed between such layers.

The base substrate BSB supports the layers disposed thereon. The base substrate BSB may include or be formed of an insulating material such as, for example, a polymer resin, but the disclosure is not limited thereto. Alternatively, the base substrate BSB may include a metallic material.

The barrier layer BR may be disposed on the base substrate BSB. The barrier layer BR may prevent the diffusion of impurity ions and the infiltration of moisture or external air and may perform a surface planarization function. The barrier layer BR may include silicon nitride, silicon oxide, or silicon oxynitride. The barrier layer BR may be omitted depending on the type of the base substrate BSB or the process conditions for the base substrate BSB.

The buffer layer BF may be disposed on the barrier layer BR. The buffer layer BF may include at least one selected from silicon nitride, silicon oxide, and silicon oxynitride. The buffer layer BF may be omitted depending on the type of the base substrate BSB or the process conditions for the base substrate BSB.

The first semiconductor layer ACT1 may be disposed on the buffer layer BF. The first semiconductor layer ACT1 may be disposed in the first transistor region TR1.

The first semiconductor layer ACT1 may include or be formed of polycrystalline silicon, monocrystalline silicon, or amorphous silicon.

The first semiconductor layer ACT1 may include a channel region ACT1c, which is disposed to overlap a first gate electrode GAT1 in a thickness direction, and first and second source/drain regions ACT1a and ACT1b, which are disposed on either side of the channel region ACT1c. As the first and second source/drain regions ACT1a and ACT1b of the first semiconductor layer ACT1 include a large number of carrier ions, the first and second source/drain regions ACT1*a* and ACT1*b* may have higher conductivity and lower resistance than the channel region ACT1*c*.

The first gate insulating film GI1 may be disposed on the first semiconductor layer ACT1. The first gate insulating film GI1 may cover not only the entire top surface of the first semiconductor layer ACT1 except for first and second contact holes CNT1 and CNT2, but also side surfaces of the first semiconductor layer ACT1. The first gate insulating film GI1 may be disposed substantially on the entire surface of the base substrate BSB.

The first gate insulating film GI1 may include a silicon compound or a metal oxide.

The first conductive layer CL1 is disposed on the first gate insulating film GI1. The first conductive layer CL1 may be a gate conductive layer and may include the first gate electrode GAT1 of the silicon transistor, which is disposed in the first transistor region TR1. The first gate electrode GAT1 may be the gate electrode of the silicon transistor. The first gate electrode GAT1 may be connected to a capacitor first electrode.

The second gate insulating film GI2 may be disposed on the first conductive layer CL1. The second gate insulating film GI2 may be disposed substantially on the entire surface of the first gate insulating film GI1.

The second conductive layer CL2 is disposed on the second gate insulating film GI2. The second conductive layer CL2 may be a capacitor conductive layer and may include a capacitor second electrode GAT2, which is disposed in the first transistor region TR1. The capacitor second electrode GAT2 may face the capacitor first electrode, which is connected to the first gate electrode GAT1, with the second gate insulating film GI2 interposed therebetween and may form a capacitor together with the capacitor first electrode.

The first interlayer insulating film ILD1 is disposed on the second conductive layer CL2. The first interlayer insulating film ILD1 may be a single film or a multifilm consisting of films of different materials from each other.

The second semiconductor layer ACT2 is disposed on the first interlayer insulating film ILD1. The second semiconductor layer ACT2 may be disposed in the second transistor region TR2. The second semiconductor layer ACT2 may include an oxide semiconductor.

The second semiconductor layer ACT2 may include a channel region ACT2*c*, which is disposed to overlap a third gate electrode GAT3 in the thickness direction, and first and second source/drain regions ACT2*a* and ACT2*b*, which are disposed on either side of the channel region ACT2*c*. The first and second source/drain regions ACT2*a* and ACT2*b* of the second semiconductor layer ACT2, which are conductive regions, may have higher conductivity and lower resistance than the channel region ACT2*c*.

The third gate insulating film GI3 is disposed on the second semiconductor layer ACT2. The third gate insulating film GI3, unlike the first and second gate insulating films GI1 and GI2, may be disposed only in some regions. The third gate insulating film GI3 may cover the channel region ACT2*c* of the second semiconductor layer ACT2 and may expose the first and second source/drain regions ACT2*a* and ACT2*b* and side surfaces of the second semiconductor layer ACT2.

The third conductive layer CL3 is disposed on the third gate insulating film GI3. The third conductive layer CL3 may be a gate conductive layer and may include the third gate electrode GAT3 of the oxide semiconductor, which is disposed in the second transistor region TR2.

The second interlayer insulating film ILD2 is disposed on the third conductive layer CL3. The second interlayer insulating film ILD2 may be a single film or a multifilm consisting of films of different materials from each other.

The fourth conductive layer CL4 is disposed on the second interlayer insulating film ILD2. The fourth conductive layer CL4 may be a data conductive layer and may include first and second source/drain electrodes SD1*a* and SD1*b* of the silicon transistor, which is disposed in the first transistor region TR1, and first and second source/drain electrodes SD2*a* and SD2*b* of the oxide transistor, which is disposed in the second transistor region TR2.

In the silicon transistor in the first transistor region TR1, the first source/drain electrode SD1*a* may be connected to the first source/drain region ACT1*a* of the first semiconductor layer ACT1 through the first contact hole CNT1, which exposes the first source/drain region ACT1*a* through the second interlayer insulating film ILD2, the second gate insulating film GI2, and the first gate insulating film GI1, and the second source/drain electrode SD1*b* may be connected to the second source/drain region ACT1*b* of the first semiconductor layer ACT1 through the second contact hole CNT2, which exposes the second source/drain region ACT1*b* through the second interlayer insulating film ILD2, the second gate insulating film GI2, and the first gate insulating film GI1.

In the oxide transistor in the second transistor region TR2, the first source/drain electrode SD2*a* may be connected to the first source/drain region ACT2*a* of the second semiconductor layer ACT2 through a third contact hole CNT3, which exposes the first source/drain region ACT2*a* through the second interlayer insulating film ILD2, and the second source/drain electrode SD2*b* may be connected to the second source/drain region ACT2*b* of the second semiconductor layer ACT2 through a fourth contact hole CNT4, which exposes the second source/drain region ACT2*b* through the second interlayer insulating film ILD2.

The first via layer VIA1 is disposed on the fourth conductive layer CL4. The first via layer VIA1 may include an inorganic insulating material or an organic insulating material. The first via layer VIA1 may be a single film or a multifilm consisting of films of different materials from each other.

The via layer VIA1 is disposed on the second interlayer insulating film ILD2 to completely cover the top surface of the second interlayer insulating film ILD2. In an embodiment where the first via layer VIA1 is formed as or defined by an organic film, the top surface of the first via layer VIA1 may be flat regardless of any underlying height differences.

The fifth conductive layer CL5 is disposed on the first via layer VIA1. The fifth conductive layer CL5 may include a connecting electrode CTE. A fifth contact hole CNT5, which exposes the second source/drain electrode SD1*b* of the silicon transistor in the first transistor region TR1, may be disposed in the first via layer VIA1, and the connecting electrode CTE may be connected to the second source/drain electrode SD1*b* through the fifth contact hole CNT5.

The second via layer VIA2 is disposed on the connecting electrode CTE. The second via layer VIA2 may include an inorganic insulating material or an organic insulating material. The second via layer VIA2 may be a single film or a multifilm consisting of films of different materials from each other.

The pixel electrode ANO is disposed on the second via layer VIA2. The pixel electrode ANO may be an anode electrode. Separate pixel electrodes ANO may be provided for different pixels PX. The pixel electrode ANO may be electrically connected to the connecting electrode CTE through a sixth contact hole CNT6, which penetrates the second via layer VIA2 and exposes part of the connecting electrode CTE.

The pixel-defining film PDL may be disposed on the pixel electrode ANO. In an embodiment, an opening, which exposes part of the pixel electrode ANO, may be defined through the pixel-defining film PDL. The pixel-defining film PDL may include or be formed of an organic insulating material or an inorganic insulating material.

An emission layer EL is disposed on part of the pixel electrode ANO, exposed by the pixel-defining film PDL. The emission layer EL may include an organic material layer. The emission layer EL may further include a hole injection/transfer layer and/or an electron injection/transfer layer.

A common electrode CAT may be disposed on the emission layer EL. The common electrode CAT may be disposed in common for all the pixels PX. The pixel electrode ANO, the emission layer EL, and the common electrode CAT may form or collectively define an organic light-emitting element together.

A thin-film encapsulation layer TFEL, which includes a first inorganic film TFE1, a first organic film TFE2, and a second inorganic film TFE3, is disposed on the common electrode CAT. The first and second inorganic films TFE1 and TFE3 may be in contact with each other at ends of the thin-film encapsulation layer TFEL. The first organic film TFE2 may be sealed by the first and second inorganic films TFE1 and TFE3.

The first, second, third, fourth, and fifth conductive layers CL1, CL2, CL3, CL4, and CL5 and the first and second semiconductor layers ACT1 and ACT2 may be formed by deposition (such as sputtering) and patterning. In an embodiment, deposition is desired to be performed at a high deposition density to stably form patterns such as the first, second, third, fourth, and fifth conductive layers CL1, CL2, CL3, CL4, and CL5 and the first and second semiconductor layers ACT1 and ACT2. An embodiment of a sputtering device capable of depositing a target material at a high deposition density will hereinafter be described.

Figure 3:
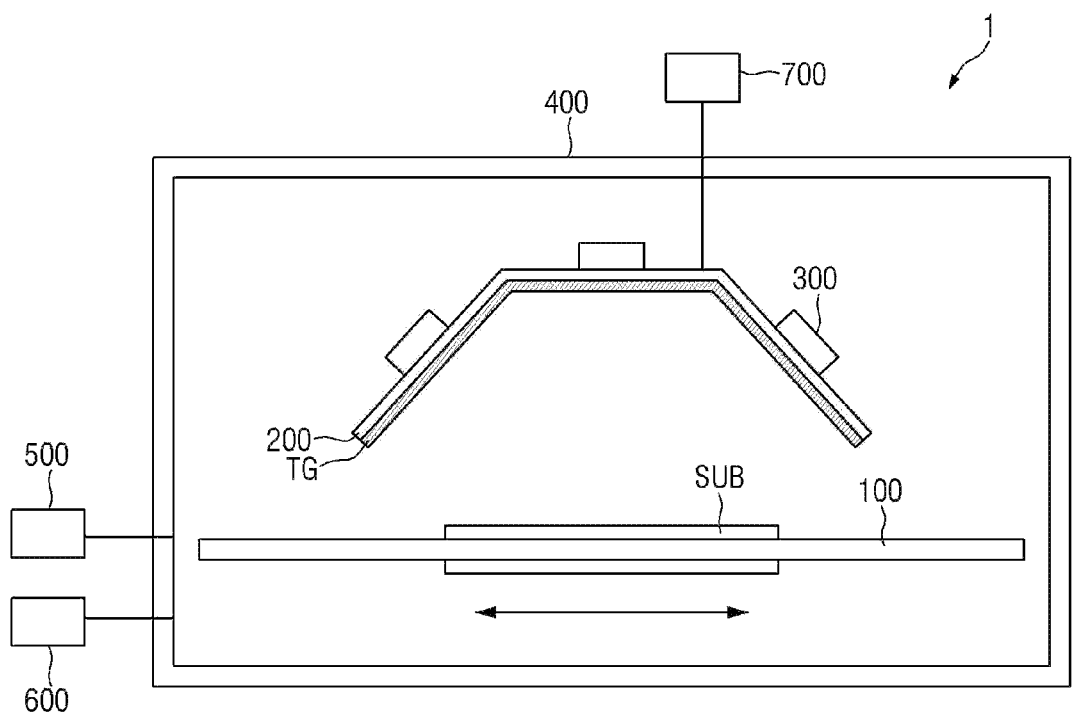
FIG. 3 is a schematic view of a sputtering device according to an embodiment of the disclosure.
Figure 4:
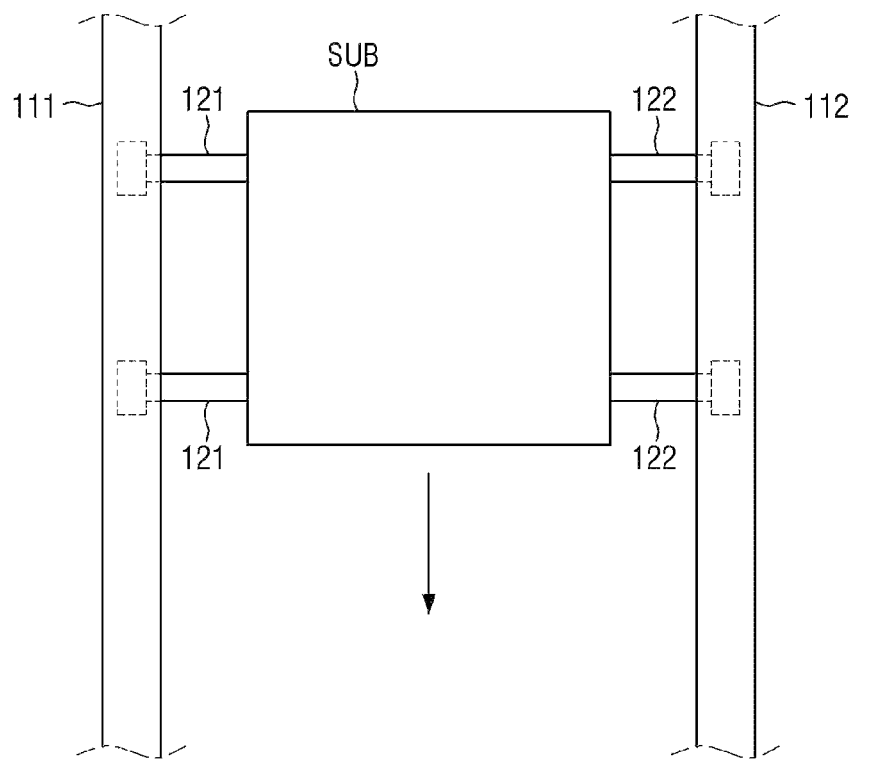
FIG. 4 is a plan view of a substrate transferring unit of the sputtering device of FIG. 3.

FIG. 3 is a schematic view of a sputtering device according to an embodiment of the disclosure. FIG. 4 is a plan view of a substrate transferring unit of the sputtering device of FIG. 3.

Referring to FIGS. 3 and 4, an embodiment of a sputtering device 1 may include a chamber 400, and a substrate transferring unit 100, a back plate 200 and magnets 300, which are disposed inside the chamber 400.

The substrate transferring unit 100 may transfer a target substrate SUB. The substrate transferring unit 100 may move the target substrate SUB in a predetermined direction. As will be described later, the substrate transferring unit 100 may move the target substrate SUB not only within, but also beyond the overlapping area of the substrate transferring unit 100 and the back plate 200. The substrate transferring unit 100 may change the moving direction of the target substrate SUB when the at least part of the target substrate SUB is beyond the overlapping area of the substrate transferring unit 100 and the back plate 200. As a result, films may be uniformly formed on the entire target substrate SUB.

In an embodiment, as shown in FIG. 4, the substrate transferring unit 100 may include a frame 110 and a support 120. The frame 110 may include first and second guiding parts 111 and 112, which extend in a same direction as each other. The support 120 may include first supporting parts 121, which move along the first guiding part 111, and second supporting parts 122, which move along the second guiding part 112. That is, the first supporting parts 121 and the second supporting parts 122 may move along the direction where the first and second guiding parts 111 and 112 extend.

The first supporting parts 121 may be disposed to face the second supporting parts 122. The first supporting parts 121 and the second supporting parts 122 may support opposite side surfaces of the target substrate SUB. In an embodiment, the first supporting parts 121 may support one side surface of the target substrate SUB, and the second supporting parts 122 may support the other side surface of the target substrate SUB. The first supporting parts 121 and the second supporting parts 122 may be provided in plural, but the disclosure is not limited thereto.

The back plate 200 may support a target TG. In an embodiment, the target TG may be fixed to one surface of the back plate 200. The shape of the back plate 200 and the relationship between the back plate 200 and the substrate transferring unit 100 will be described later with reference to FIG. 5.

The target TG may be disposed on the surface of the back plate 200. In an embodiment, the target TG may be disposed on a surface of the back plate 200 that faces the substrate transferring unit 100.

The target TG may be a target deposition material to be deposited by plasma generated in the chamber 400. The target TG may be disposed on the back plate 200 to face the target substrate SUB.

The target TG may include a material to be deposited on the target substrate SUB. In an embodiment, for example, the target TG may include at least one metals for forming an electrode, such as aluminum (Al), molybdenum (Mo), copper (Cu), gold (Au), or platinum (Pt) or may include a transparent material for forming a transparent electrode, such as indium tin oxide ("ITO"). In an alternative embodiment, for example, a plurality of targets TG including different materials from each other, for example, two targets TG including different materials from each other, may be provided, and in such an embodiment, materials to be formed on the target substrate SUB may be controlled in various manners.

The magnets 300 may be disposed on a surface of the back plate 200 that is opposite to the surface of the back plate 200 where the target TG is disposed. The magnets 300 may form a magnetic field. As will be described later, a plurality of magnets 300 having opposite polarities may be alternately installed to form a magnetic field on the entire surface of the target TG. The magnets 300 may scan the target TG while reciprocating over the back plate 200.

The chamber 400 may provide space in which a deposition process is allowed to be performed by the sputtering device 1. A vacuum atmosphere may be formed in the chamber 400 by a vacuum pump 500.

The vacuum pump 500 may provide negative pressure inside the chamber 400 and may thus form a vacuum atmosphere inside the chamber 400 so that a deposition process may be smoothly performed. Here, the vacuum atmosphere may simply refer to a pressure lower than the atmospheric pressure, rather than a complete vacuum.

A gas supply unit 600 may be connected to the inside of the chamber 400. The gas supply unit 600 may provide an inert gas such as argon (Ar) to the inside of the chamber 400. The inert gas may be ionized by plasma and may thus collide with the target TG, thereby generating target particles ("TP") of FIG. 6).

A power supply unit 700 may be electrically connected to the back plate 200. The power supply unit 700 may supply radio frequency ("RF") or direct current ("DC") power to the back plate 200. The back plate 200, which is provided with power by the power supply unit 700, may function as a cathode during the discharge of plasma. Specifically, in response to a voltage being applied to the back plate 200, the discharge of plasma occurs inside the chamber 400, and as a result, the inert gas such as Ar may be ionized. Ionized particles may accelerate toward the target TG and may thus collide with the target TG. Accordingly, the target particles TP that form the target TG may be released and may be deposited on the target substrate SUB. Although not specifically illustrated, the sputtering device 1 may further include a shield, which functions as an anode.

The locations of the target substrate SUB, the substrate transferring unit 100, the target TG, the back plate 200, and the magnets 300 in the sputtering device 1 will hereinafter be described in greater detail with reference to FIGS. 5 through 13.

Figure 5:
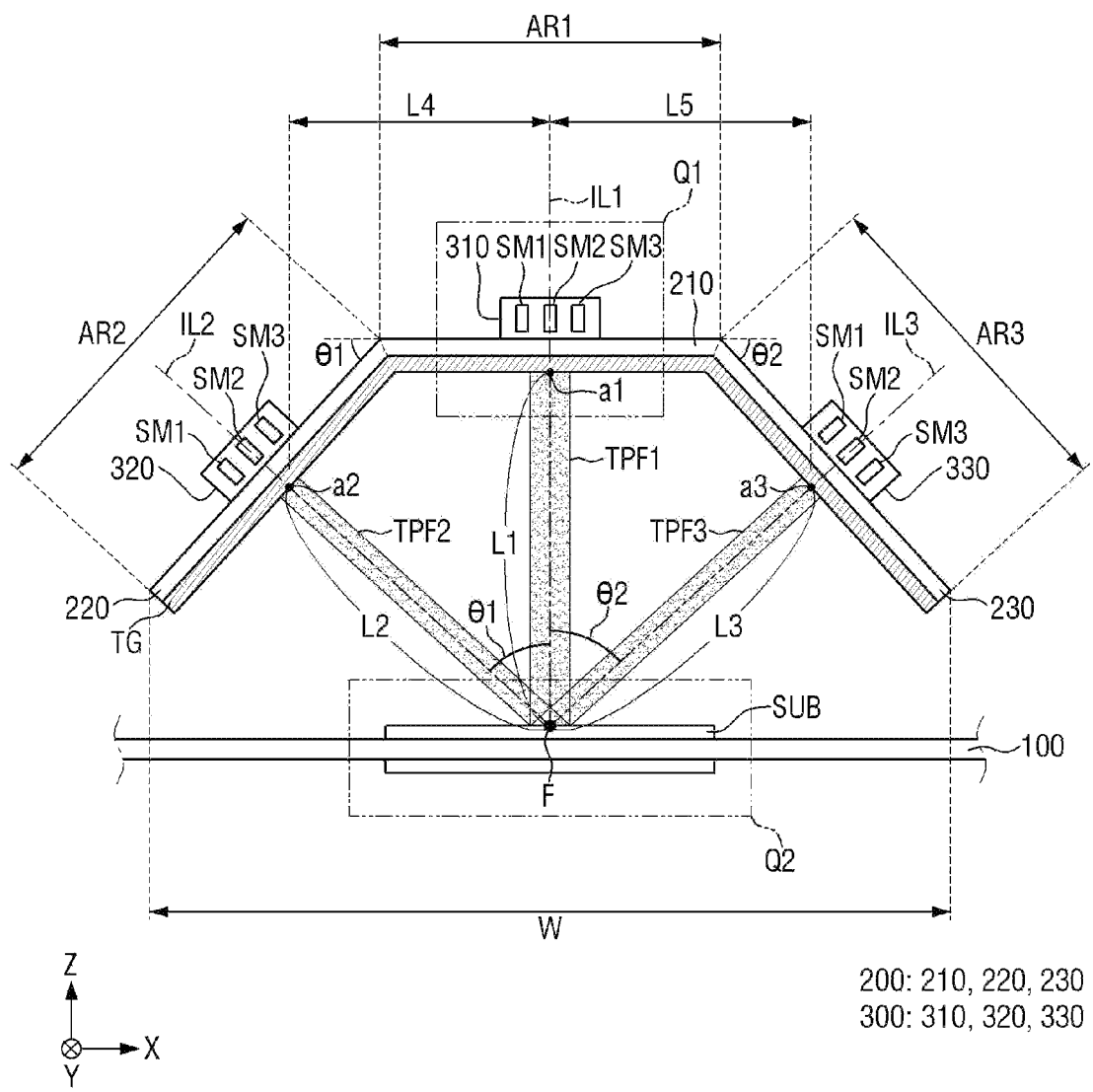
FIG. 5 is a schematic view illustrating the locations of a back plate and the substrate transferring unit in the sputtering device of FIG. 3.
Figure 6:
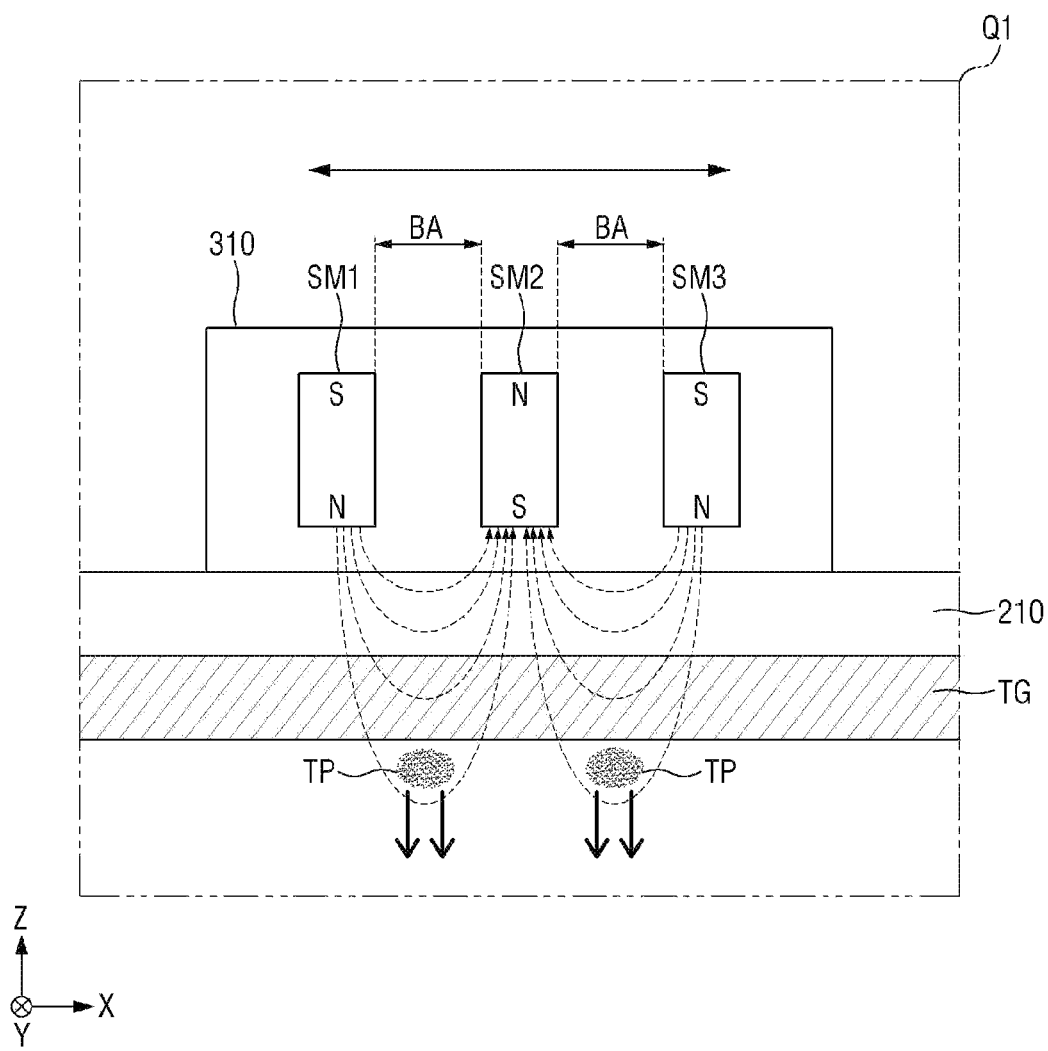
FIG. 6 is an enlarged view of an area Q1 of FIG. 5.

FIG. 5 is a schematic view illustrating the locations of the back plate and the substrate transferring unit in the sputtering device of FIG. 3. FIG. 6 is an enlarged view of an area Q1 of FIG. 5.

Figure 7:
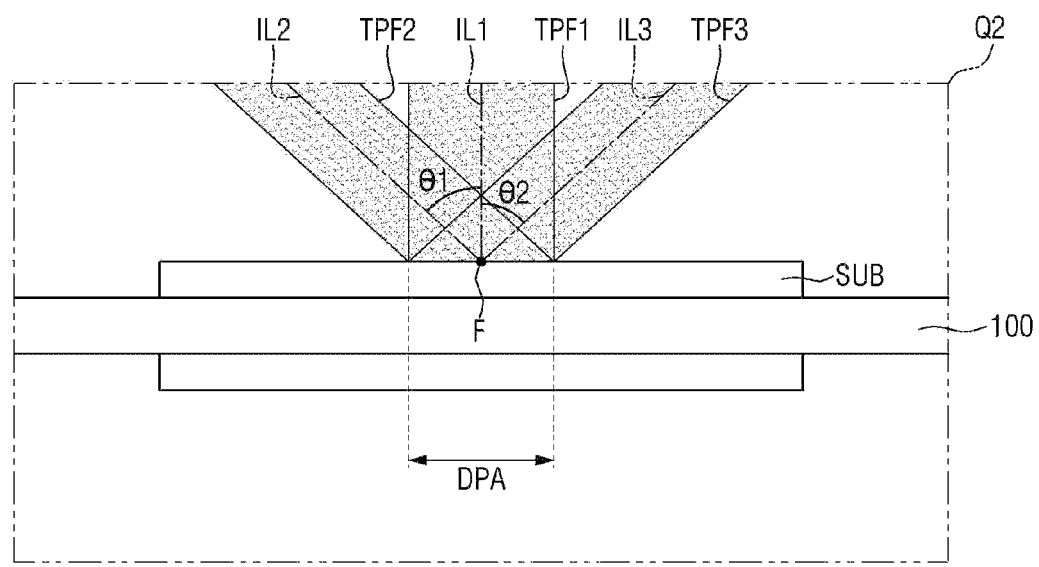
FIG. 7 is an enlarged view of an area Q2 of FIG. 5.

Referring to FIGS. 5 through 7, in an embodiment of the sputtering device, the back plate 200 may include a first portion 210, which is disposed in a first area AR1, a second portion 220, which is disposed in a second area AR2 on a second side, in a first direction X, of the first area AR1, and a third portion 230, which is disposed in a third area AR3 on a first side, in the first direction X, of the first area AR1. The first, second, and third portions 210, 220, and 230 may be connected to one another or may be integrally formed as a single unitary body. The first portion 210 may be positioned between the second and third portions 220 and 230.

The first portion 210 may be disposed to be parallel to the substrate transferring unit 100. The second and third portions 220 and 230 may be bent and obliquely extend from the first portion 210. In an embodiment, the second portion 220 may be bent and extend in the opposite direction of a third direction Z from a second end, in the first direction X, of the first portion 210 at a first angle θ1, and the third portion 230 may be bent and extend in the opposite direction of the third direction Z from a first end, in the first direction X, of the first portion 210 at a second angle θ2. In such an embodiment, the third portion 230 may extend from the first portion 210 in a direction opposite to the direction in which the second portion 220 extends from the first portion 210. The first and second angles θ1 and θ2 may be the same as each other, but the disclosure is not limited thereto. Alternatively, the first and second angles θ1 and θ2 may be different from each other.

The target TG may be disposed on the surface of the back plate 200 that faces the substrate transferring unit 100, and the magnets 300 may be disposed on the other surface of the back plate 200. First, second, and third magnets 310, 320, and 330 may be disposed on the first, second, and third portions 210, 220, and 230, respectively, of the back plate 200. Although not specifically illustrated, the first, second, and third magnets 310, 320, and 330 may extend in a second direction Y.

Each of the first, second, and third magnets 310, 320, and 330 may include three sub-magnets (SM1, SM2, and SM3), but the disclosure is not limited thereto. The number of sub-magnets (SM1, SM2, and SM3) included in each of the first, second, and third magnets 310, 320, and 330 may be a multiple of 3. The pattern of arrangement and the structure of the sub-magnets (SM1, SM2, and SM3) may be the same as each other between the first, second, and third magnets 310, 320, and 330, and thus only the sub-magnets (SM1, SM2, and SM3) of the first magnet 310 will hereinafter be described in detail for convenience of description.

Referring to FIG. 6, the first magnet 310 may include first, second, and third sub-magnets SM1, SM2, and SM3. The first, second, and third sub-magnets SM1, SM2, and SM3 may be sequentially arranged in the first direction X. Although not specifically illustrated, the first, second, and third sub-magnets SM1, SM2, and SM3 may extend in the second direction Y.

The first, second, and third sub-magnets SM1, SM2, and SM3 may have different polarities in the third direction Z. A second end, in the third direction Z, of the first sub-magnet SM1 that faces the surface of the back plate 200 where the target TG is disposed may be an N pole, and a first end, in the third direction Z, of the first sub-magnet SM1 that is opposite to the second end of the first sub-magnet SM1 may be an S pole. A second end, in the third direction Z, of the second sub-magnet SM2 that faces the surface of the back plate 200 where the target TG is disposed may be an S pole, and a first end, in the third direction Z, of the second sub-magnet SM2 that is opposite to the second end of the second sub-magnet SM2 may be an N pole. A second end, in the third direction Z, of the third sub-magnet SM3 that faces the surface of the back plate 200 where the target TG is disposed may be an N pole, and a first end, in the third direction Z, of the third sub-magnet SM3 that is opposite to the second end of the third sub-magnet SM3 may be an S pole. In such an embodiment, the first, second, and third sub-magnets SM1, SM2, and SM3, which are adjacent to one another, may have different polarities in the third direction Z. In such an embodiment, each of the first, second, and third sub-magnets SM1, SM2, and SM3 may have opposite polarities at opposing ends thereof in the third direction Z, and facing (or corresponding) ends of adjacent sub-magnets among the first, second, and third sub-magnets SM1, SM2, and SM3 may have opposite polarities.

Due to such an arrangement of the sub-magnets (SM1, SM2, and SM3) of each of the magnets 300, the magnets 300 may form a magnetic field on the other side, in the third direction Z, of the target TG. In an embodiment, for example, a magnetic field may be formed between the sub-magnets (SM1, SM2, and SM3) of each of the magnets 300, the magnets 300 in a direction from an N pole to an S pole. This magnetic field may accelerate the generation of plasm by controlling the movement of electrons in a plasma area BA.

Plasma may be generated on a front surface of the target TG between the first, second, and third sub-magnets SM1, SM2, and SM3. The front surface of the target TG may refer to a surface of the target TG that is opposite to the surface of the target TG where the back plate 200 is disposed. That is, the plasma area BA, which is an area where plasma is generated, may be positioned between the first and second sub-magnets SM1 and SM2 and between the second and third sub-magnets SM2 and SM3. In other words, the plasm area BA may be formed on the target TG, on the opposite side of the back plate 200. Plasma may be generated in the plasma area BA so that an inert gas such as Ar may be ionized. Ionized Ar particles may allow the material of the target TG to be released, and as a result, the target particles TP may be generated.

The target particles TP may move and be deposited on the target substrate SUB while forming particle beams TPF having straightness. The particle beams TPF may extend in a direction normal to a region where the target particles TP are released. In other words, the particle beams TPF may extend in a direction perpendicular to the tangent plane of the region where the target particles TP are released.

Referring back to FIG. 5, the particle beams TPF may include a first particle beam TPF1, which is generated in part of the first area AR1 that overlaps the first magnet 310, a second particle beam TPF2, which is generated in part of the second area AR2 that overlaps the second magnet 320, and a third particle beam TPF3, which is generated in part of the third area AR3 that overlaps the third magnet 330.

In an embodiment, the magnets 300 may reciprocate on the back plate 200. Accordingly, any irregular erosions that may occur on the target TG due to a prolonged exposure of the target TG to the magnets 300 may be effectively prevented.

Erosion points (a1, a2, and a3) where the erosion of the target TG occurs may be formed on the front surface of the target TG. The erosion points (a1, a2, and a3) may be points at the front of the target TG that are passed through by imaginary normal lines (IL1, IL2, and IL3) passing through the centers of the magnets 300. The normal lines (IL1, IL2, and IL3) may be perpendicular to the front surface of the target TG. In an embodiment, the first normal line IL1 may be perpendicular to the first portion 210, the second normal line IL2 may be perpendicular to the second portion 220, and the third normal line IL3 may be perpendicular to the third portion 230. In an embodiment, for example, a first erosion point a1, which is a point that is passed through by a first normal line IL1 passing through the center of the first magnet 310, a second erosion point a2, which is a point that is passed through by a second normal line IL2 passing through the center of the second magnet 320, and a third erosion point a3, which is a point that is passed through by a third normal line IL3 passing through the center of the third magnet 330, may be formed on the front surface of the target TG.

The first normal line IL1 passes through the center of the first magnet 310 and may be a normal line drawn in a region overlapping the first portion 210 of the target TG. The second normal line IL2 passes through the center of the second magnet 320 and may be a normal line drawn in a region overlapping the second portion 220 of the target TG. The third normal line IL3 passes through the center of the third magnet 330 and may be a normal line drawn in a region overlapping the third portion 230 of the target TG.

The first, second, and third normal lines IL1, IL2, and IL3 may intersect one another at one location. The first and second normal lines IL1 and IL2 may intersect each other at the first angle θ1. The first and third normal lines IL1 and IL3 may intersect each other at the second angle θ2.

The location where the first, second, and third normal lines IL1, IL2, and IL3 intersect one another may be a deposition focal point F. Although not specifically illustrated, the deposition focal point F may extend in the second direction Y. During sputtering, the target substrate SUB may be disposed in a way such that the deposition focal point F may fall on the top surface of the target substrate SUB. In an embodiment, the deposition focal point F may not fall on the top surface of the target substrate SUB and may fall within the target substrate SUB, as illustrated in FIG. 5.

Target particles TP released from the first, second, and third erosion points a1, a2, and a3 may be deposited at the deposition focal point F on the top surface of the target substrate SUB.

Even though the first magnet 310 reciprocates, a distance L1 from the first erosion point a1 to the deposition focal point F may be uniformly maintained. However, as the second and third magnets 320 and 330 reciprocate, a distance L2 from the second erosion point a2 to the deposition focal point F and a distance L3 from the third erosion point a3 to the deposition focal point F may vary.

The angle at which the second portion 220 of the back plate 200 is bent from the first portion 210 of the back plate 200, i.e., the first angle θ1, the distance L2 from the second erosion point a2 to the deposition focal point F, and a distance L4, in the first direction X, between the first and second erosion points a1 and a2 may satisfy Equation (1):

$$L2 = \frac{L4}{\sin\theta 1}. \qquad \text{Equation (1)}$$

The angle at which the third portion 230 of the back plate 200 is bent from the first portion 210 of the back plate 200, i.e., the second angle θ2, the distance L3 from the third erosion point a3 to the deposition focal point F, and a distance L5, in the first direction X, between the first and third erosion points a1 and a3 may satisfy Equation (2):

$$L3 = \frac{L5}{\sin\theta 2}. \qquad \text{Equation (2)}$$

A sputtering process may be performed by the sputtering device 1 while moving the target substrate SUB. Thus, the sputtering process may be performed while the deposition focal point F is moving on the target substrate SUB. As a result, films may be relatively uniformly formed on the target substrate SUB. The target substrate SUB may be moved by the substrate transferring unit 100. During the sputtering process, the range of movement of the target substrate SUB by the substrate transferring unit 100 may be greater than a width W of the back plate 200.

The particle beams TPF and regions in the target substrate SUB into which the target particles TP are to be deposited will hereinafter be described.

Figure 8:
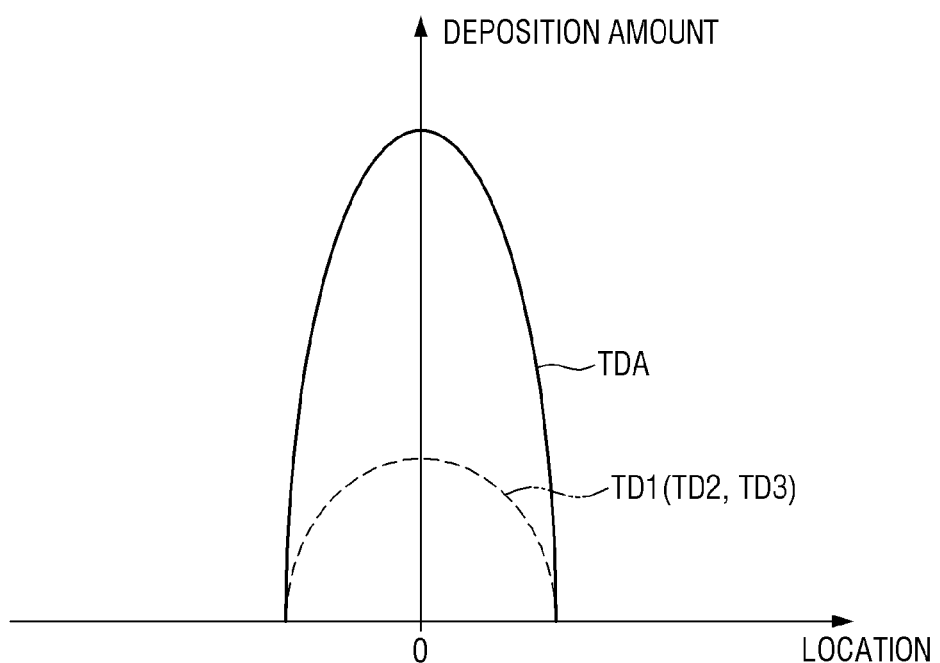
FIG. 8 is a graph showing a deposition amount profile according to the embodiment of FIG. 7.

FIG. 7 is an enlarged view of an area Q2 of FIG. 5. FIG. 8 is a graph showing a deposition amount profile according to the embodiment of FIG. 7.

Referring to FIGS. 7 and 8, the first, second, and third particle beams TPF1, TPF2, and TPF3 may be projected on the target substrate SUB. Target particles TP included in the first particle beam TPF1, target particles TP included in the second particle beam TPF2, and target particles TP included in the third particle beam TPF3 may all be deposited into a same deposition area DPA on the target substrate SUB.

The target particles TP included in the first particle beam TPF1 may be deposited into the deposition area DPA on the target substrate SUB to exhibit a first deposition profile TD1. The target particles TP included in the second particle beam TPF2 may be deposited into the deposition area DPA on the target substrate SUB to exhibit a second deposition profile TD2. The target particles TP included in the third particle beam TPF3 may be deposited into the deposition area DPA on the target substrate SUB to exhibit a third deposition profile TD3. The first, second, and third deposition profiles TD1, TD2, and TD3 may have a same shape substantially at a same location. A total deposition profile TDA formed by the first, second, and third particle beams TPF1, TPF2, and TPF3 may show a relatively large deposition amount for the deposition area DPA.

Figure 9:
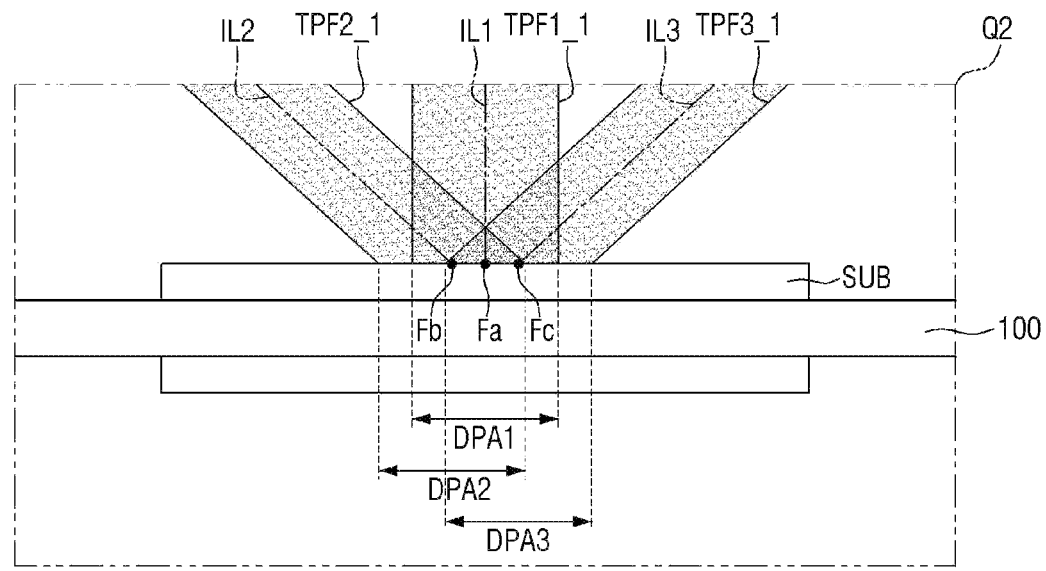
FIG. 9 is an enlarged view of the area Q2 of FIG. 5.
Figure 10:
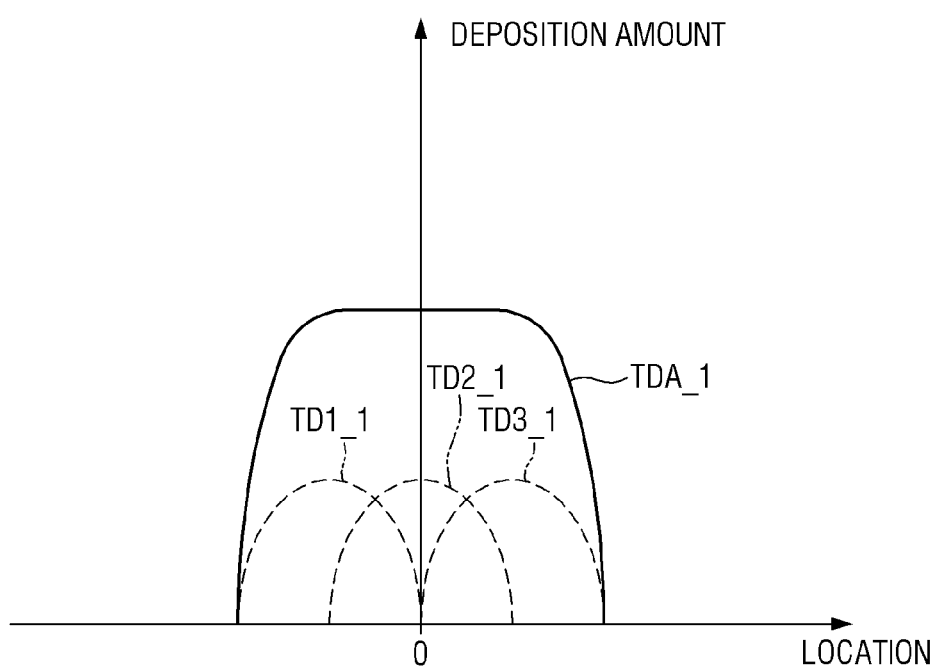
FIG. 10 is a graph showing a deposition amount profile according to the embodiment of FIG. 9.

FIG. 9 is an enlarged view of the area Q2 of FIG. 5. FIG. 10 is a graph showing a deposition amount profile according to the embodiment of FIG. 9.

An embodiment where first, second, and third particle beams TPF1_1, TPF2_1, and TPF3_1 are projected and deposited onto a target substrate SUB in a way such that first, second, and third deposition areas DPA1, DPA2, and DPA3 may partially overlap one another will hereinafter be described.

Referring to FIGS. 9 and 10, the first, second, and third particle beams TPF1_1, TPF2_1, and TPF3_1 may be projected onto the target substrate SUB. Target particles TP included in the first particle beam TPF1_1, target particles TP included in the second particle beam TPF2_1, and target particles TP included in the third particle beam TPF3_1 may be deposited into different deposition areas on the target substrate SUB, i.e., the first, second, and third deposition areas DPA1, DPA2, and DPA3. In such an embodiment, the target particles TP included in the first particle beam TPF1_1 may be deposited into the first deposition area DPA1, the target particles TP included in the second particle beam TPF2_1 may be deposited into the second deposition area DPA2, and the target particles TP included in the third particle beam TPF3_1 may be deposited into the third deposition area DPA3.

A deposition focal point Fa, which is the center of the first deposition area DPA1, a deposition focal point Fb, which is the center of the second deposition area DPA2, and a deposition focal point Fc, which is the center of the third deposition area DPA3, may be at different locations. In an embodiment, for example, the deposition focal points Fb and Fc may be positioned on the opposite sides, in a first direction X, of the deposition focal point Fa.

The first, second, and third deposition areas DPA1, DPA2, and DPA3 may partially overlap one another. In such an embodiment, the first deposition area DPA1 may partially overlap at least one selected from the second and third deposition areas DPA2 and DPA2, the second deposition area DPA2 may partially overlap at least one selected from the first and third deposition areas DPA1 and DPA3, and the third deposition area DPA3 may partially overlap at least one selected from the first and second deposition areas DPA1 and DPA2.

The target particles TP included in the first particle beam TPF1_1 may be deposited into the first deposition area DPA1 on the target substrate SUB to exhibit a first deposition profile TD1_1. The target particles TP included in the second particle beam TPF2_1 may be deposited into the second deposition area DPA2 on the target substrate SUB to exhibit a second deposition profile TD2_1. The target particles TP included in the third particle beam TPF3_1 may be deposited into the third deposition area DPA3 on the target substrate SUB to exhibit a third deposition profile TD3_1.

A total deposition profile TDA_1 formed by the first, second, and third particle beams TPF1_1, TPF2_1, and TPF3_1 may show a relatively large deposition amount for the overlapping areas of the first, second, and third deposition areas DPA1, 2, and 3.

Figure 11:
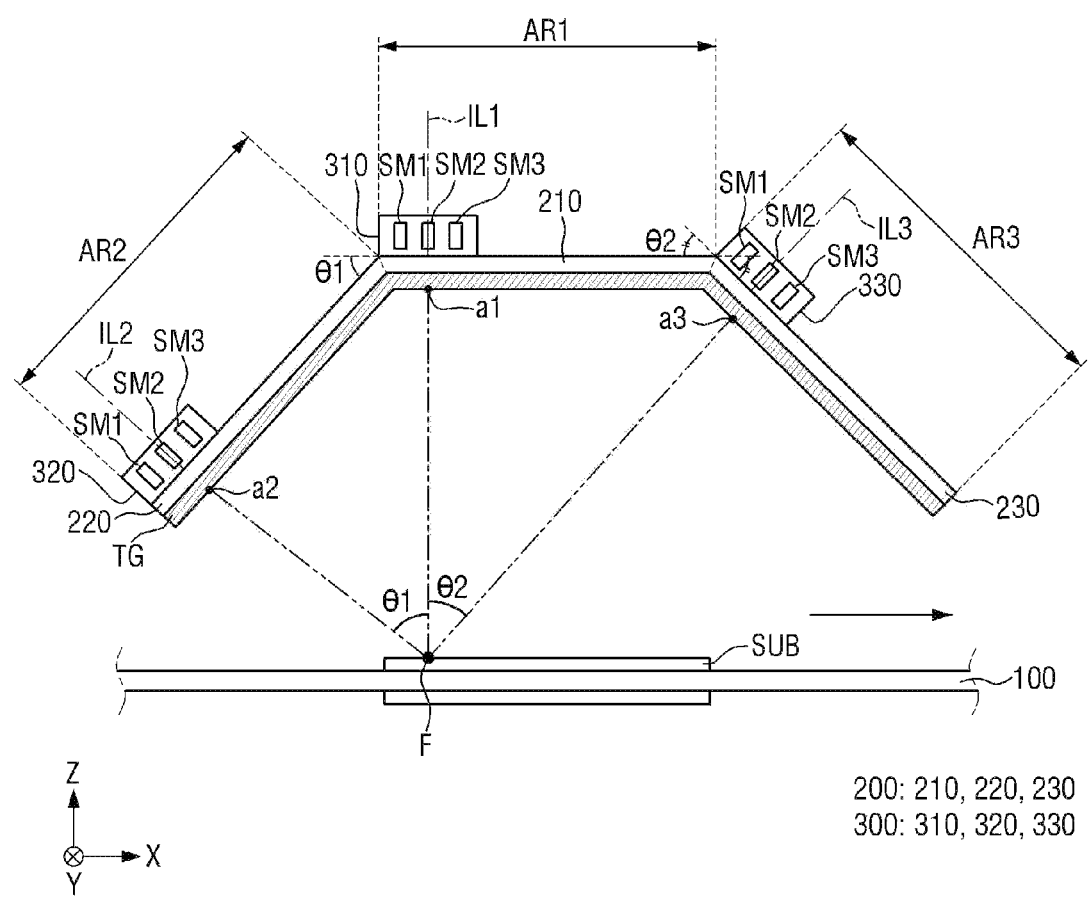
FIGS. 11 through 13 are schematic views illustrating the movement of a deposition focal point in accordance with the movement of magnets.
Figure 12:
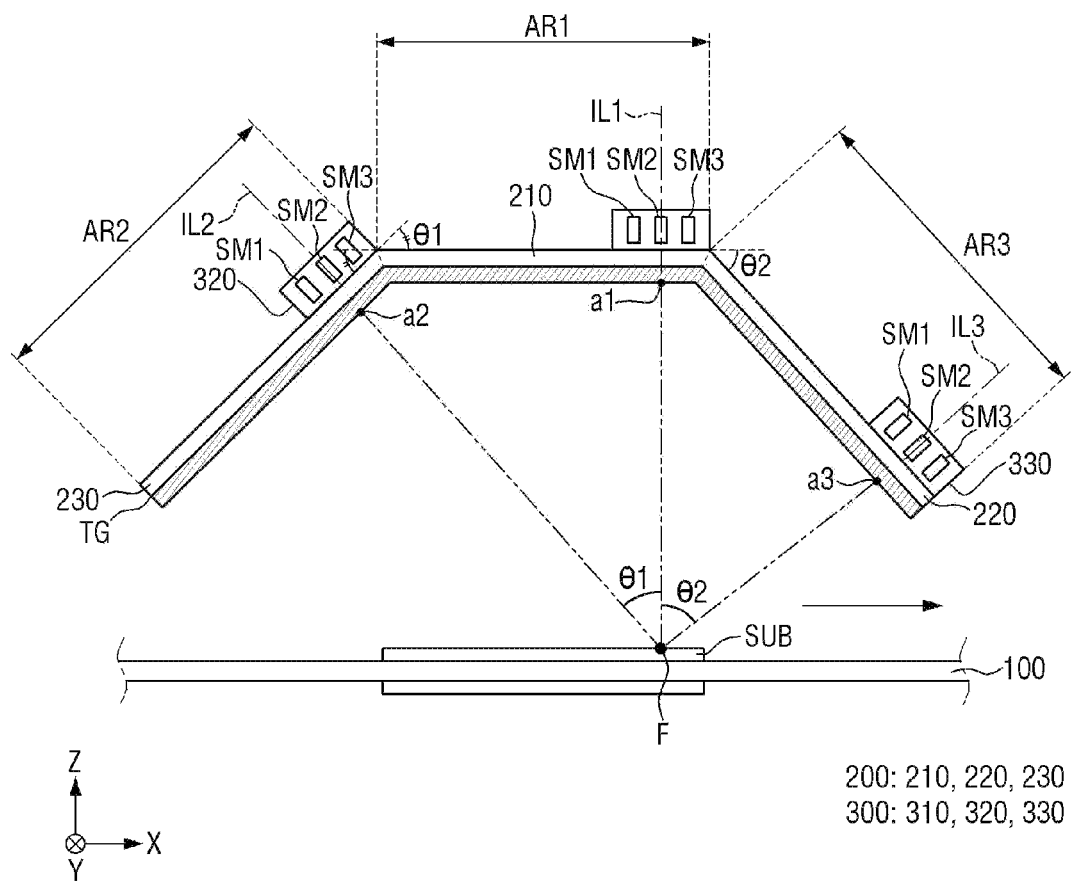
Figure 13:
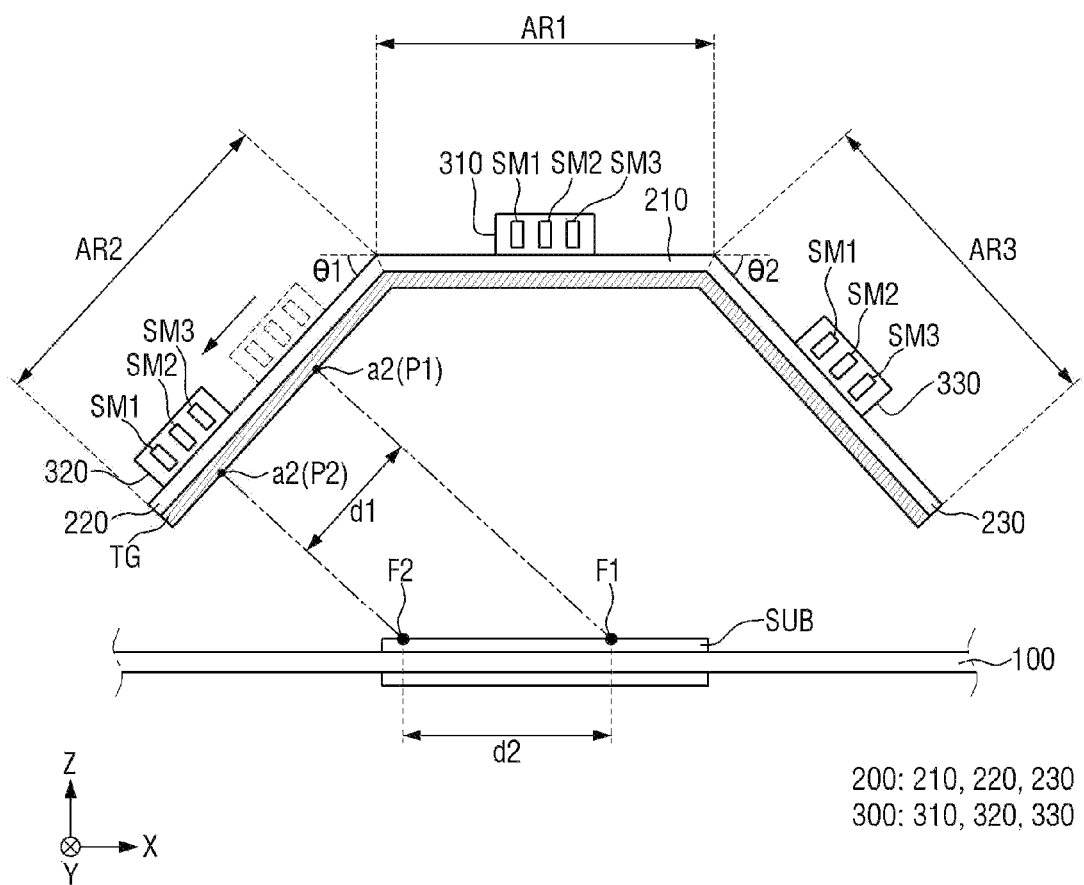

FIGS. 11 through 13 are schematic views illustrating the movement of the deposition focal point in accordance with the movement of the magnets.

Referring to FIGS. 11 through 13, the first, second, and third magnets 310, 320, and 330 may reciprocate from one side to the other side of the first, second, and third areas AR1, AR2, and AR3, respectively. In an embodiment, the first magnet 310 may reciprocate between opposing sides, in the first direction X, of the first area AR1, the second magnet 320 may reciprocate between opposing sides, in the first direction X, of the second area AR2, and the third magnet 330 may reciprocate between opposing sides, in the first direction X, of the third area AR3. In such an embodiment, the first magnet 310 may reciprocate on the first portion 210 of the back plate 200, the second magnet 320 may reciprocate on the second portion 220 of the back plate 200, and the third magnet 330 may reciprocate on the third portion 230 of the back plate 200.

During the reciprocation of the first, second, and third magnets 310, 320, and 330, the angle between the first and second normal lines IL1 and INL2 may be maintained at the first angle θ1, and the angle between the first and third normal lines IL1 and IL3 may be maintained at the second angle θ2. In an embodiment, as described above, the first angle θ1 may refer to the angle at which the second portion 220 of the back plate 200 is bent from the first portion 210 of the back plate 200, and the second angle θ2 may refer to the angle at which the third portion 230 of the back plate 200 is bent from the first portion 210 of the back plate 200.

As the first, second, and third magnets 310, 320, and 330 reciprocate, the deposition focal point F formed on the target substrate SUB may move in the first direction X. For convenience of illustration, the target substrate SUB is illustrated in FIGS. 11 and 12 as being fixed, but the target substrate SUB may actually be movable by the substrate transferring unit 100.

As the magnets 300 reciprocate, the first, second, and third erosion points a1, a2, and a3 of the target TG may move, and the deposition focal point F on the target substrate F may also move accordingly. In an embodiment, for example, the second erosion point a2 of the second magnet 320 may move from a first location P1 to a second location P2 by as much as a first distance d1. When the second erosion point a2 is at the first location P1, deposition may be performed at a first deposition focal point F1 on the target substrate SUB, and when the second erosion point a2 is at the second location P2, deposition may be performed at a second deposition focal point F2 on the target substrate SUB. When the first and second locations P1 and P2 are apart from each other by as much as the first distance d1, the first and second deposition focal points F1 and F2 may be apart from each other by as much as a second distance d2.

In a case where the second portion 220 of the back plate 200 where the second magnet 320 is disposed is bent from a plane parallel to the top surface of the target substrate SUB at the first angle θ1, the first and second distances d1 and d2 may satisfy Equation (3):

$$d1 = d2 \times \cos \theta 1 \qquad \text{Equation (3)}.$$

The sputtering device 1 can form thin films with a high deposition density by forming the deposition focal point F. Also, as sputtering is performed while moving the target substrate SUB via the substrate transferring unit 100, films may be uniformly formed on the target substrate SUB.

The second and third areas AR2 and AR3 may satisfy Equation (4):

$$AR2 = AR1 \times \cos \theta 1 \quad AR3 = AR1 \times \cos \theta 2 \qquad \text{Equation (4)}.$$

When the moving speeds of the first, second, and third magnets 310, 320, and 330 are defined as first, second, and third speeds V1, V2, and V3, respectively, the second and third speeds V2 and V3 may satisfy Equation (5):

$$V2 = V1 \times \cos \theta 1 \quad V3 = V1 \times \cos \theta 2 \qquad \text{Equation (5)}$$

Sputtering devices according to alternative embodiments of the disclosure will hereinafter be described, focusing mainly on the differences with the sputtering device 1.

Figure 14:
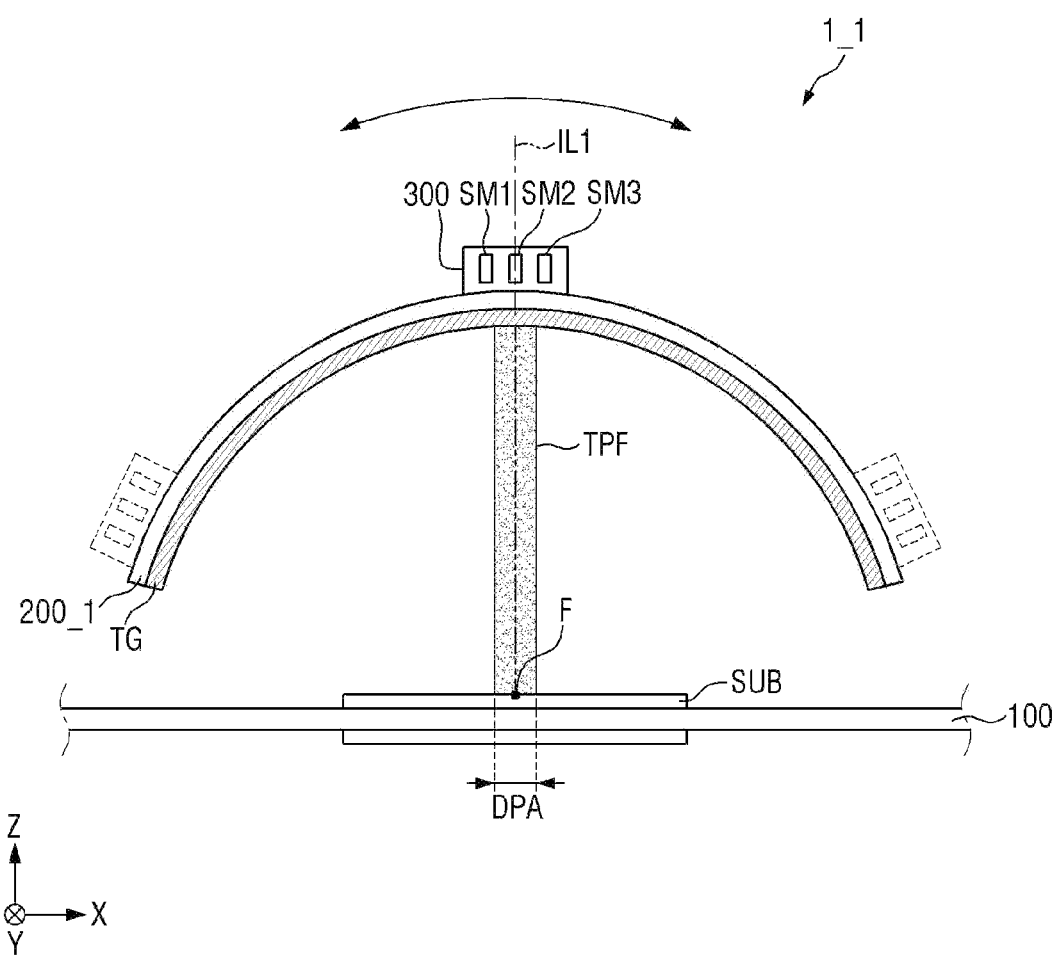
FIG. 14 is a schematic view of a sputtering device according to an alternative embodiment of the disclosure.

FIG. 14 is a schematic view of a sputtering device according to an alternative embodiment of the disclosure.

A sputtering device 1_1 shown in FIG. 14 is substantially the same as the sputtering device 1 described above except for the shape of a back plate 200_1. The same or like elements shown in FIG. 14 have been labeled with the same reference characters as used above to describe the embodiment of the sputtering device shown in FIGS. 3 to 13, and any repetitive detailed description thereof will hereinafter be omitted or simplified.

In an embodiment, as shown in FIG. 14, the back plate 200_1 may have a curved shape. The center of the curvature of the bottom surface of the back plate 200_1 may correspond to a deposition focal point F formed on a target substrate SUB. In such an embodiment, the back plate 200_1 may have an arc shape in a cross-sectional view. The center of the arc shape of the back plate 200_1 may coincide with the deposition focal point F formed on the target substrate SUB. The back plate 200_1 may have a cylindrical sidewall shape having an axis extending in a second direction Y as its center. The back plate 200_1 may be disposed to surround the target substrate SUB.

A target TG may be disposed on one surface of the back plate 200_1, and a magnet 300 may be movable on the opposing surface of the target TG. Even though the magnet 300 is movable, a first normal line IL1 passing through the center of the magnet 300 may pass through the center of the arc shape of the back plate 200_1.

When the target substrate SUB is not being moved, the sputtering device 1_1 may project target particle beams TPF toward a same deposition focal point F regardless of the movement of the magnet 300. Thus, when the target substrate SUB is not being moved, the target particle beams TPF may be projected onto a deposition area on the target substrate SUB to form films. During a sputtering process using the sputtering device 1_1, the target substrate SUB may be moved by a substrate transferring unit 100.

In an embodiment, the sputtering device 1_1 may form thin films with a high deposition density by forming the deposition focal point F. In such an embodiment, as sputtering is performed while moving the target substrate SUB via the substrate transferring unit 100, films may be uniformly formed on the target substrate SUB.

In such an embodiment, as the sputtering device 1_1 includes the back plate 200_1, which has a curved shape, the sputtering device 1_1 may project the target particle beams TPF toward the deposition focal point F. Thus, the thickness of films to be formed may be precisely controlled by properly moving the target substrate SUB.

Figure 15:
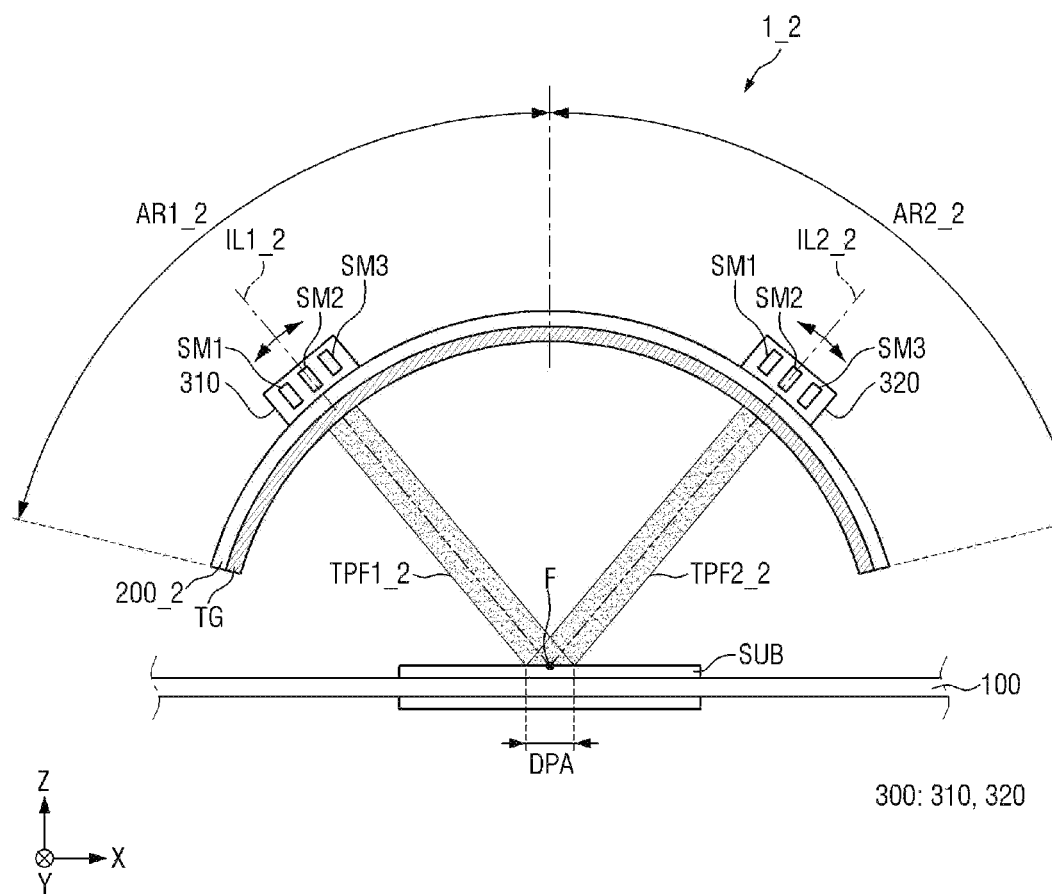
FIG. 15 is a schematic view of a sputtering device according to another alternative embodiment of the disclosure.

FIG. 15 is a schematic view of a sputtering device according to another alternative embodiment of the disclosure.

A sputtering device 1_2 shown in FIG. 15 is substantially the same as the sputtering device 1_1 of FIG. 14 except that a plurality of magnets including first magnets 310 and second magnets 320 are included.

In an embodiment, a back plate 200_2 of the sputtering device 1_2 may have a curved shape. The center of the curvature of the bottom surface of the back plate 200_2 may correspond to a deposition focal point F formed on a target substrate SUB. In such an embodiment, the back plate 200_2 may have an arc shape in a cross-sectional view. The center of the arc shape of the back plate 200_2 may coincide with the deposition focal point F on the target substrate SUB. The back plate 200_2 may have a cylindrical sidewall shape having an axis extending in a second direction Y as its center. The back plate 200_2 may be disposed to surround the target substrate SUB. The back plate 200_2 may be substantially the same as the back plate 200_1 of the sputtering device 1_1 of FIG. 14.

The back plate 200_2 may be divided into a plurality of areas (AR1_2 and AR2_2). In an embodiment, for example, the back plate 200_2 may be divided into two halves along a reference line extending in a second direction Y, i.e., first and second areas AR1_2 and AR2_2.

In such an embodiment, a plurality of magnets 300 may be provided. In an embodiment, for example, the magnets 300 may include first and second magnets 310 and 320, which are movable in the first and second areas AR1_2 and AR2_2, respectively, but the number of magnets 300 is not particularly limited. In such an embodiment, a first normal line IL1_2 passing through the center of the first magnet 310 may pass through the center of the arc shape of the back plate 200_2, and a second normal line IL2_2 passing through the center of the second magnet 320 may pass through the center of the arc shape of the back plate 200_2. Target particle beams TPF1_2, which are formed in the overlapping area of a target TG and the first magnet 310, may proceed toward the deposition focal point F and may be deposited onto a deposition area DPA of the target substrate SUB. Target particle beams TPF2_2, which are formed in the overlapping area of the target TG and the second magnet 320, may proceed toward the deposition focal point F and may be deposited onto the deposition area DPA of the target substrate SUB.

The first and second magnets 310 and 320 may be movable on the back plate 200_2 during a sputtering process using the sputtering device 1_2. Here, the distance between the first and second magnets 310 and 320 may be uniformly maintained. That is, the moving speeds of the first and second magnets 310 and 320 may be the same as each other, but the disclosure is not limited thereto. Alternatively, the moving speeds of the first and second magnets 310 and 320 may differ from each other, and as a result, the distance between the first and second magnets 310 and 320 may vary.

The sputtering device 1_2 may form thin films with a high deposition density by forming the deposition focal point F. In such an embodiment, as sputtering is performed while moving the target substrate SUB via a substrate transferring unit 100, films may be uniformly formed on the target substrate SUB.

In such an embodiment, as the sputtering device 1_2 includes the back plate 200_2, which has a curved shape, the sputtering device 1_2 may project the target particle beams TPF1_2 and the target particle beams TPF2_2 toward the deposition focal point F. Thus, the thickness of films to be formed may be precisely controlled by properly moving the target substrate SUB. In such an embodiment, as the sputtering device 1_2 includes a plurality of magnets 300, films with a high density may be efficiently formed.

Figure 16:
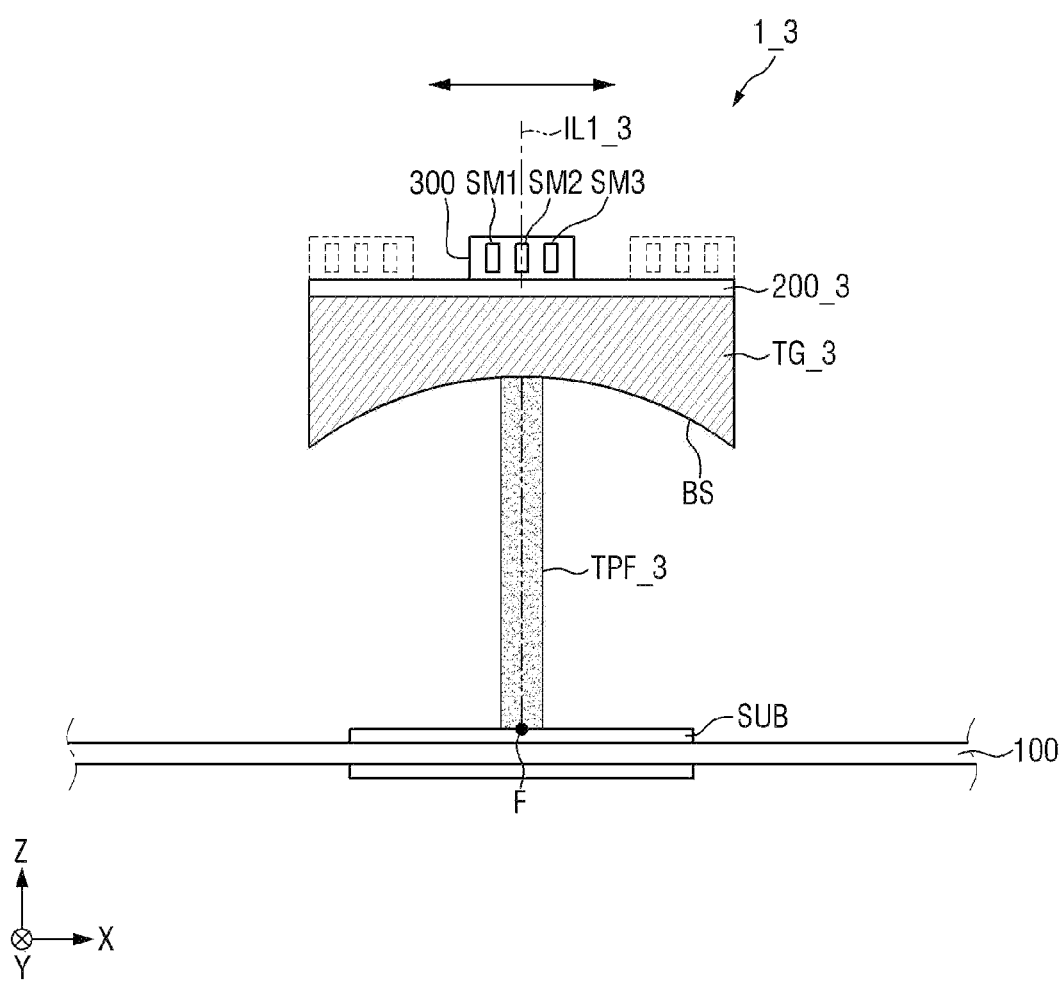
FIG. 16 is a schematic view of a sputtering device according to another alternative embodiment of the disclosure.

FIG. 16 is a schematic view of a sputtering device according to another alternative embodiment of the disclosure.

A sputtering device 1_3 shown in FIG. 16 is substantially the same as the sputtering device 1 described above with reference to FIGS. 3 to 13 except for the shapes of a back plate 200_3 and a target TG_3.

In an embodiment, as shown in FIG. 16, the back plate 200_3 may be parallel to a substrate transferring unit 100 and a target substrate SUB. The target TG_3 may be disposed on a bottom surface BS of the back plate 200_3 that faces the substrate transferring unit 100 and the target substrate SUB. The bottom surface BS of the target TG_3 may have an arc shape centered on a deposition focal point F, which extends in a second direction Y.

A magnet 300 may be disposed on the top surface of the back plate 200_3 that is opposite to the bottom surface BS of the back plate 200_3. The magnet 300 may reciprocate on the top surface of the back plate 200_3. Target particle beams TPF_3 may be formed in the overlapping area of the bottom surface of the target TG_3 and the magnet 300 and may proceed toward the deposition focal point F of the target substrate SUB. As a result, the material of the target TG_3 may be deposited on the target substrate SUB.

A normal line IL1_3 passing through the center of the magnet 300 may extend in the normal direction of part of the bottom surface BS of the target TG_3 that overlaps the magnet 300. Thus, even though the magnet 300 is being moved during a sputtering process using the sputtering device 1_3, the target particle beams TPF_3 may be concentrated onto a single deposition focal point F.

In such an embodiment, the sputtering device 1_3 may form thin films with a high deposition density by forming the deposition focal point F. In such an embodiment, as sputtering is performed while moving the target substrate SUB via the substrate transferring unit 100, films may be uniformly formed on the target substrate SUB.

In such an embodiment, the sputtering device 1_3 may form thin films with a high deposition density by controlling the shape of the target TG_3, which is disposed on the back plate 200_3.

Figure 17:
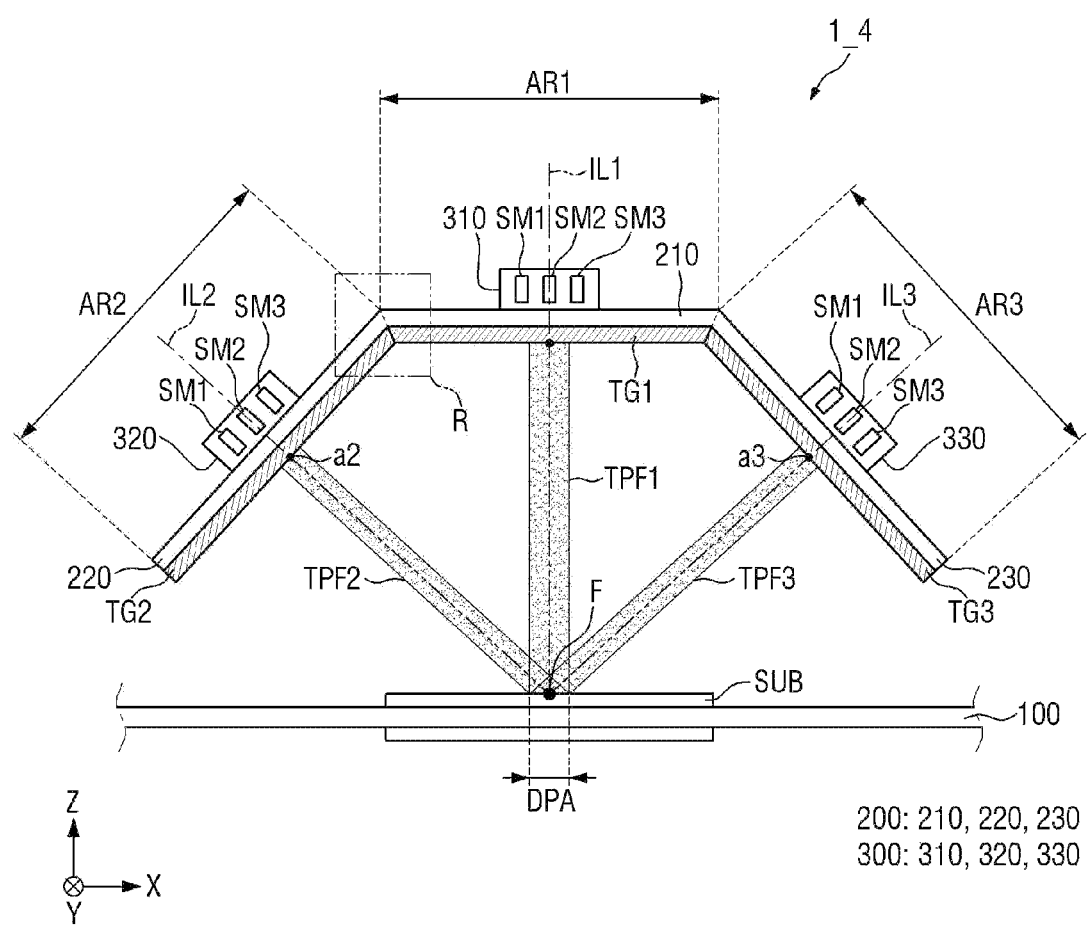
FIG. 17 is a schematic view of a sputtering device according to another alternative embodiment of the disclosure.
Figure 18:
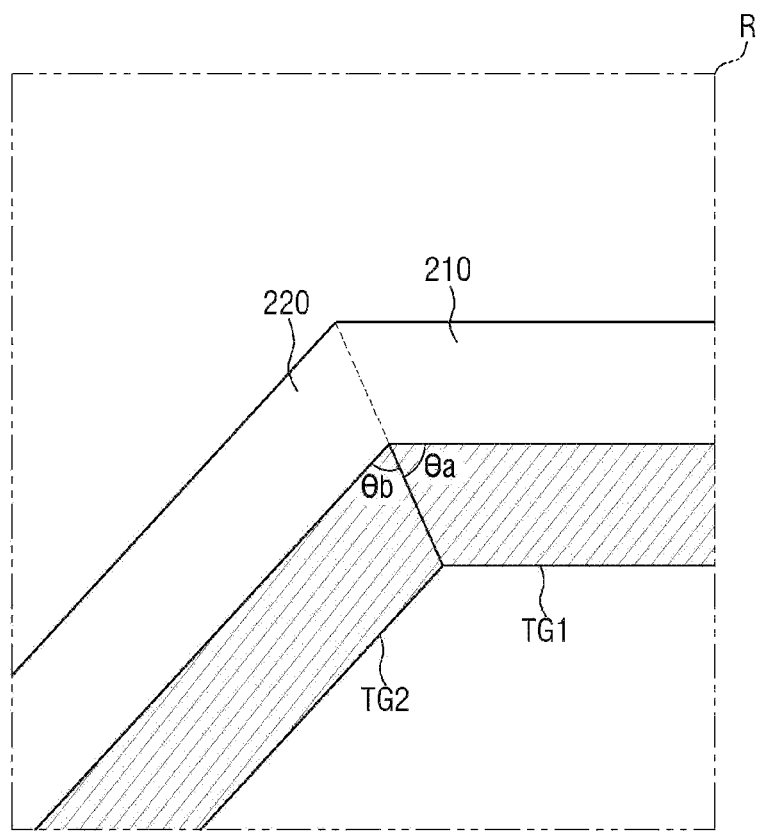
FIG. 18 is an enlarged view of an area R of FIG. 17.

FIG. 17 is a schematic view of a sputtering device according to another alternative embodiment of the disclosure. FIG. 18 is an enlarged view of an area R of FIG. 17.

Referring to FIGS. 17 and 18, a sputtering device 1_4 is substantially the same as the sputtering device 1 described above with reference to FIGS. 3 to 13 except that the sputtering device 1_4 includes multiple targets (TG1, TG2, and TG3).

In an embodiment, the targets (TG1, TG2, and TG3) may include first, second, and third targets TG1, TG2, and TG3, which are disposed on first, second, and third portions 210, 220, and 220, respectively, of a back plate 200.

The first, second, and third targets TG1, TG2, and TG3 may not be integrally formed with each other, but may be separate from one another. An interface may be formed between the first and second targets TG1 and TG2, and an interface may be formed between the first and third targets TG1 and TG3.

Acute angles may be formed between the back plate 200 and the interfaces between the first, second, and third targets TG1, TG2, and TG3. In an embodiment, for example, as illustrated in FIG. 18, an angle θa between the interface between the first and second targets TG1 and TG2 and the interface between the first target TG1 and the first portion 210 of the back plate 200 may be less than about 90°, and an angle θb between the interface between the first and second targets TG1 and TG2 and the interface between the second target TG2 and the second portion 220 of the back plate 200 may be less than about 90°. FIG. 18 illustrates only a portion of the back plate 200 where the first and second targets TG1 and TG2 meet, but the above description may also be directly applicable to a portion of the back plate 200 where the first and third targets TG1 and TG3 meet.

At least two of the first, second, and third targets TG1, TG2, and TG3 may include a same material as each other. In an embodiment, for example, the first, second, and third targets TG1, TG2, and TG3 may all include a same material as each other, or two of the first, second, and third targets TG1, TG2, and TG3 may include a same material as each other. However, the disclosure is not limited to this. Alternatively, the first, second, and third targets TG1, TG2, and TG3 may all include different materials from each other.

The sputtering device 1_4 may form thin films with a high deposition density by forming a deposition focal point F. In such an embodiment, as sputtering is performed while moving a target substrate SUB via a substrate transferring unit 100, films can be uniformly formed on the target substrate SUB.

In such an embodiment, as the sputtering device 1_4 includes the first, second, and third targets TG1, TG2, and TG3, which are separate from one another, the sputtering device 1_4 may mix and deposit different materials on the target substrate SUB via one process.

Figure 19:
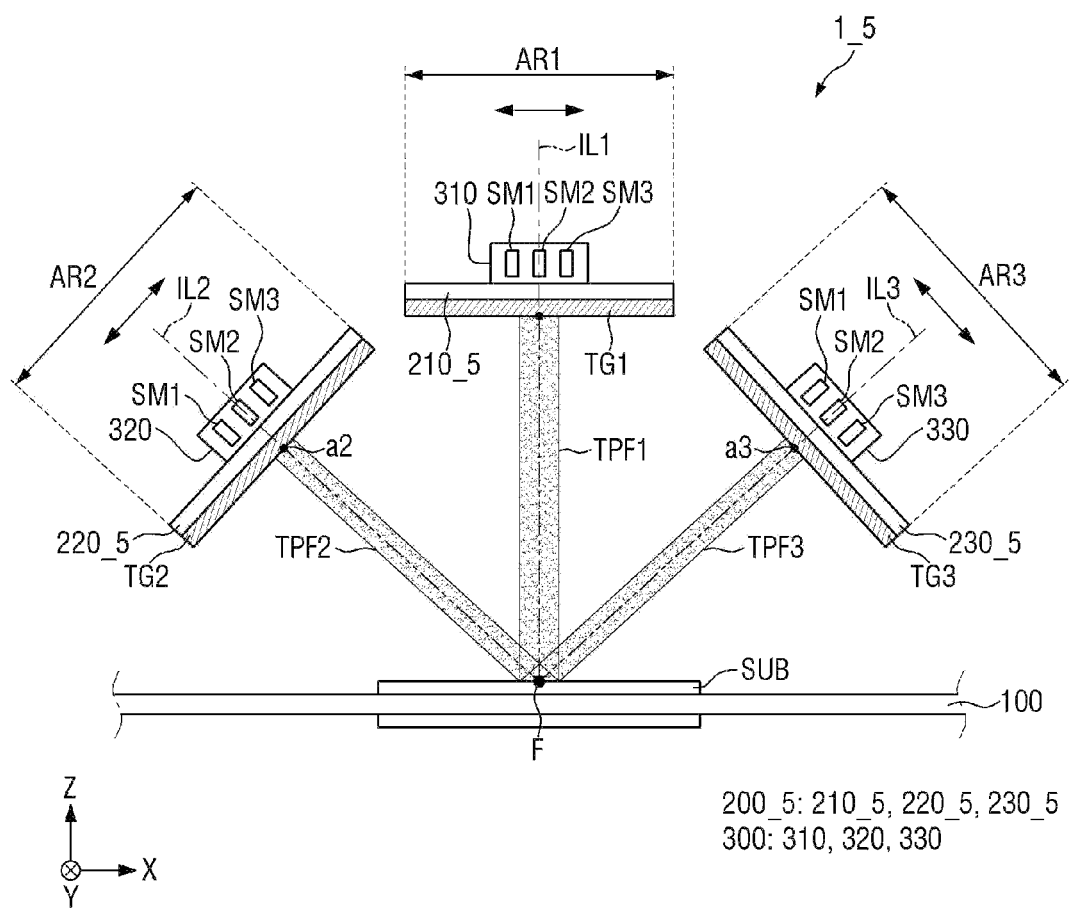
FIG. 19 is a schematic view of a sputtering device according to another alternative embodiment of the disclosure.

FIG. 19 is a schematic view of a sputtering device according to another alternative embodiment of the disclosure.

A sputtering device 1_5 shown in FIG. 19 is substantially the same as the sputtering device 1 described above with reference to FIGS. 3 to 13 except that a back plate 200_5 includes parts that are separate and spaced apart from one another.

In an embodiment, as shown in FIG. 19, the back plate 200_5 may include first, second, and third portions 210_5, 220_5, and 230_5, which are separate from one another. The first portion 210_5 may be parallel to a substrate transferring unit 100 and a target substrate SUB. The second and third portions 220_5 and 230_5 may be inclined with respect to the first portion 210_5. The second and third portions 220_5 and 230_5 may be disposed on the opposite sides, in a first direction X, of the first portion 210_5.

The first, second, and third portions 210_5, 220_5, and 230_5 may be spaced apart from one another. In such an embodiment, the first and second portions 210_5 and 220_5 may be spaced apart from each other, and the first and third portions 210_5 and 230_5 may be spaced apart from each other.

Targets (TG1, TG2, and TG3) may be disposed on the back plate 200_5. In an embodiment, first, second, and third targets TG1, TG2, and TG3 may be disposed on the first, second, and third portions 210_5, 220_5, and 230_5, respectively, of the back plate 200_5.

At least two of the first, second, and third targets TG1, TG2, and TG3 may include the same material. In an embodiment, for example, the first, second, and third targets TG1, TG2, and TG3 may all include a same material as each other, or two of the first, second, and third targets TG1, TG2, and TG3 may include a same material as each other. However, the disclosure is not limited to this. Alternatively, the first, second, and third targets TG1, TG2, and TG3 may all include different materials from each other.

The sputtering device 1_5 may form thin films with a high deposition density by forming a deposition focal point F. In such an embodiment, as sputtering is performed while moving the target substrate SUB via the substrate transferring unit 100, films may be uniformly formed on the target substrate SUB.

In such an embodiment, as the sputtering device 1_5 includes the back plate 200_5, which includes parts that are separate and spaced apart from one another, and the first, second, and third targets TG1, TG2, and TG3, which are disposed on the first, second, and third portions 210_5, 220_5, and 230_5, respectively, of the back plate 200_5, the sputtering device 1_5 may mix and deposit different materials on the target substrate SUB via one process.

In embodiments according to the invention, the sputtering device may form a thin film having a high deposition density by depositing a thin film while forming a deposition focus.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A sputtering device comprising:
a substrate transferring unit which moves a substrate;
a back plate disposed above the substrate transferring unit and supporting a target; and
a magnet disposed on a second surface of the back plate which is opposite to a first surface of the back plate facing the substrate transferring unit,
wherein
the back plate includes a first portion, which extends in a first direction, and a second portion, which is bent and extends from the first portion in a predetermined direction at a first angle,
the magnet includes a first magnet, which is disposed on the first portion, and second magnet, which is disposed on the second portion,
the first magnet reciprocates in the first direction on the first portion between opposing sides thereof in the first direction,
the second magnet reciprocates in the predetermined direction on the second portion between opposing sides thereof in the predetermined direction,
target particles included in a first particle beam generated by the first magnet is deposited into a first deposition area on the substrate,
target particles included in a second particle beam generated by the second magnet is deposited into a second deposition area on the substrate,
the first deposition area and the second deposition area overlap each other during reciprocations of the first magnet and the second magnet, and
an overlapping area of the first deposition area and the second deposition area reciprocates in the first direction by the reciprocations of the first magnet and the second magnet.

2. The sputtering device of claim 1, wherein a first line drawn from a surface of the first portion toward the substrate transferring unit and a second line drawn from a surface of the second portion toward the substrate transferring unit intersect each other to form the first angle.

3. The sputtering device of claim 2, wherein
the first and second lines pass through a center of the first magnet and a center of the second magnet, respectively.

4. The sputtering device of claim 2, wherein the first and second lines intersect each other on the substrate.

5. The sputtering device of claim 2, wherein a distance between the first and second magnets is constant.

6. The sputtering device of claim 2, wherein
the back plate further includes a third portion, which is bent from the first portion at a second angle and extends in a direction opposite to the predetermined direction.

7. The sputtering device of claim 6, wherein
a third line drawn from a surface of the third portion toward the substrate transferring unit intersects the first line to form the second angle.

8. The sputtering device of claim 7, wherein the first, second, and third lines intersect one another at a deposition focal point.

9. The sputtering device of claim 8, wherein the deposition focal point is formed on the substrate.

10. The sputtering device of claim 1, wherein
the substrate transferring unit includes a frame, which extends in one direction, and a support, which is movable along the frame, and
the support supports side surfaces of the substrate.

11. A sputtering device comprising:
a substrate transferring unit which moves a substrate;
a back plate disposed above the substrate transferring unit and supporting a target; and
a magnet disposed on a second surface of the back plate which is opposite to a first surface of the back plate facing the substrate transferring unit,
wherein the first surface and the second surface of the back plate has a curved shape,
a center of curvature of the bottom surface of the back plate is on the substrate,
the magnet reciprocates in a predetermined direction on the second surface between opposing sides of the back plate in the predetermined direction, and
a particle beam generated by the magnet is deposited into a same deposition area on the substrate during a reciprocation of the magnet.

12. The sputtering device of claim 1, wherein the target includes a first target, which is disposed on the first portion, and a second target, which is disposed on the second portion and is separate from the first target.

13. The sputtering device of claim 12, wherein the first and second targets include different materials from each other.

14. A sputtering device comprising:
a substrate transferring unit which moves a substrate;
a back plate disposed above the substrate transferring unit and supporting a target; and
a magnet disposed on a surface of the back plate which is opposite to a surface of the back plate facing the substrate transferring unit,
wherein
the back plate includes a first portion, which is disposed in parallel to the substrate and extends in a first direction, a second portion, which is bent and extends from one side of the first portion in a first predetermined direction at a first angle, and a third portion, which is bent and extends from the other side of the first portion in a direction opposite to a second predetermined direction at a second angle,
the magnet includes a first magnet, which is disposed on the first portion, a second magnet, which is disposed on the second portion, and a third magnet, which is disposed on the third portion,
the first magnet reciprocates in the first direction on the first portion between the one side and the other side thereof,
the second magnet reciprocates in the first predetermined direction on the second portion between opposing sides in the first predetermined direction,
the third magnet reciprocates in the second predetermined direction on the third portion between opposing sides in the second predetermined direction,
target particles included in a first particle beam generated by the first magnet is deposited into a first deposition area on the substrate, target particles included in a second particle beam generated by the second magnet is deposited into a second deposition area on the substrate, target particles included in a third particle beam generated by the third magnet is deposited into a third deposition area on the substrate, the first to third deposition areas overlap each other during reciprocations of the first to third magnets, and an overlapping area of the first deposition area and the second deposition area reciprocates in the first direction by the reciprocations of the first magnet and the second magnet.

15. The sputtering device of claim 14, wherein a first line of the first portion that passes through the first magnet, a second line of the second portion that passes through the second magnet, and a third line of the third portion that passes through the third magnet intersect one another at a same location.

16. The sputtering device of claim 15, wherein
the first and second lines form the first angle, and
the first and third lines form the second angle.

17. The sputtering device of claim 14,
wherein the target includes a first target, which is disposed on the first portion, a second portion, which is disposed on the second portion and is separate from the first target, and a third target, which is disposed on the third portion and is separate from the first target, and
wherein the first, second, and third targets include different materials from each other.

* * * * *